(12) United States Patent
Kato et al.

(10) Patent No.: US 8,649,201 B2
(45) Date of Patent: Feb. 11, 2014

(54) MEMORY DEVICE, SEMICONDUCTOR DEVICE, AND DRIVING METHOD THEROF

(75) Inventors: Kiyoshi Kato, Atsugi (JP); Konami Izumi, Atsugi (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1155 days.

(21) Appl. No.: 11/883,027

(22) PCT Filed: Jan. 24, 2006

(86) PCT No.: PCT/JP2006/001395
§ 371 (c)(1),
(2), (4) Date: Jul. 25, 2007

(87) PCT Pub. No.: WO2006/080478
PCT Pub. Date: Aug. 3, 2006

(65) Prior Publication Data
US 2008/0144349 A1 Jun. 19, 2008

(30) Foreign Application Priority Data
Jan. 28, 2005 (JP) ................................ 2005-022302

(51) Int. Cl.
*G11C 17/00* (2006.01)
(52) U.S. Cl.
USPC ..................................... 365/104; 365/189.16
(58) Field of Classification Search
USPC .......................................... 365/104, 189.09
See application file for complete search history.

(56) References Cited

U.S. PATENT DOCUMENTS

| | | |
|---|---|---|
| 5,457,649 A | 10/1995 | Eichman et al. |
| 5,798,534 A * | 8/1998 | Young .............................. 257/59 |
| 5,854,494 A | 12/1998 | Yamazaki et al. |

(Continued)

FOREIGN PATENT DOCUMENTS

| | | |
|---|---|---|
| EP | 0 724 777 | 8/1996 |
| EP | 0 724 777 | 12/1999 |

(Continued)

OTHER PUBLICATIONS

White et al., "On the Go with SONOS," Jul., 2000, IEEE Circuits & Devices, pp. 22-31.*

(Continued)

*Primary Examiner* — Alexander Sofocleous
(74) *Attorney, Agent, or Firm* — Eric J. Robinson; Robinson Intellectual Property Law Office, P.C.

(57) ABSTRACT

To provide a memory device which operates with low power consumption, has high reliability of the stored data, and is small-size, light-weight and inexpensive, and a driving method thereof. In addition, to provide a semiconductor device which operates with low power consumption, has high reliability of the stored data and a long distance of radio frequency communication, and is small-size, light-weight and inexpensive, and a driving method thereof. The memory device includes a memory cell array in which at least memory elements are arranged in matrix, and a writing circuit. The memory element has a first conductive layer, a second conductive layer, and an organic compound layer formed therebetween, and the writing circuit includes a voltage generating circuit for generating a voltage in order to apply at plural times, and a timing controlling circuit for controlling output time of the voltage.

22 Claims, 24 Drawing Sheets

(56) References Cited

U.S. PATENT DOCUMENTS

| | | | |
|---|---|---|---|
| 6,323,515 B1 * | 11/2001 | Yamazaki et al. | 257/316 |
| 6,556,475 B2 * | 4/2003 | Yamazaki et al. | 365/185.03 |
| 6,597,034 B2 | 7/2003 | Yamazaki et al. | |
| 6,809,952 B2 | 10/2004 | Masui | |
| 6,812,491 B2 | 11/2004 | Kato et al. | |
| 6,900,499 B2 | 5/2005 | Yamazaki et al. | |
| 7,005,665 B2 | 2/2006 | Furkay et al. | |
| 7,027,327 B2 | 4/2006 | Yamamoto et al. | |
| 7,129,122 B2 | 10/2006 | Kato et al. | |
| 7,436,032 B2 * | 10/2008 | Kato | 257/390 |
| 7,495,278 B2 | 2/2009 | Yamazaki et al. | |
| 7,768,014 B2 * | 8/2010 | Asami | 257/68 |
| 8,114,719 B2 | 2/2012 | Kato et al. | |
| 2002/0126108 A1 | 9/2002 | Koyama et al. | |
| 2004/0164302 A1 * | 8/2004 | Arai et al. | 257/72 |
| 2004/0232475 A1 * | 11/2004 | Kataoka et al. | 257/315 |
| 2004/0240261 A1 | 12/2004 | Kano | |
| 2005/0174845 A1 | 8/2005 | Koyama et al. | |
| 2006/0267073 A1 | 11/2006 | Kato et al. | |
| 2008/0211024 A1 | 9/2008 | Kato et al. | |
| 2008/0283616 A1 * | 11/2008 | Yukawa et al. | 235/492 |

FOREIGN PATENT DOCUMENTS

| | | |
|---|---|---|
| JP | 05-314754 | 11/1993 |
| JP | 09-504657 | 5/1997 |
| JP | 11-306772 | 11/1999 |
| JP | 2000-022004 A | 1/2000 |
| JP | 2003-296681 | 10/2003 |
| JP | 2004-006730 | 1/2004 |
| JP | 2004-304179 | 10/2004 |
| JP | 2005-268802 | 9/2005 |
| JP | 2006-114875 A | 4/2006 |
| JP | 2011-049593 A | 3/2011 |
| WO | WO 96/007300 | 3/1996 |
| WO | WO 03/052827 | 6/2003 |
| WO | WO 2005119779 A1 * | 12/2005 |

OTHER PUBLICATIONS

Blalock, "EE4235/6253 Principles of VLSI Design—Lecture Notes," 1998, Mississippi University, pp. 1-9.*

Blalock, "EE4235/6253 Principles of VLSI Design—Class Policy and Syllabus," 1998, Mississippi University, pp. 1-2.*

International Search Report (Application No. PCT/JP2006/301395) dated May 16, 2006.

Written Opinion (Application No. PCT/JP2006/301395) dated May 16, 2006.

Korean Office Action (Application No. 2007-7019613) Dated Jul. 30, 2012.

* cited by examiner

MEMORY DEVICE, SEMICONDUCTOR DEVICE, AND DRIVING METHOD THEROF

TECHNICAL FIELD

The present invention relates to a memory device in which a plurality of circuits are integrated, and a driving method of the memory device. In addition, the invention relates to a semiconductor device having a memory device and capable of transmitting and receiving data, and a driving method of the semiconductor device.

BACKGROUND ART

A nonvolatile memory is one of memory devices of which market enlarges greatly at present. A demand for nonvolatile memories has been increased because of an advantage in that the memory data is not erased even when the power supply is stopped. However, there is a problem, for example, in that a manufacturing process of an EPROM, an EEPROM, or a flash memory is complicated and a writing voltage thereof is high so that complete writing cannot be performed only by one writing operation. For example, in a conventional EEPROM, after writing is performed by applying a certain writing voltage to a memory cell for a certain period, written content is read out to check whether the data written correctly. Then, if the writing is not complete, it is necessary to perform writing operation again (or example, Patent Document 1). In addition, a mask ROM has a disadvantage in that data writing can be performed only during its manufacturing process and additional writing is impossible.

Among nonvolatile memories, a write-once memory which stores data by supplying an irreversible change for a material in the memory element, is expected as a memory that the above-described disadvantages are improved.

In addition, a semiconductor device incorporating a nonvolatile memory and capable of transmitting and receiving data by radio frequency has been developed and has attracted large attention. There is a radio frequency chip as an example of such a semiconductor device, which begins to be introduced in a part of the market. Particularly, in order to use for a tag (radio frequency tag) for managing a product, a radio frequency chip that is small-size and light-weight, provides high usability and high data safety, and is inexpensive is demanded.

Japanese Patent Laid-Open No. Hei5-314754

DISCLOSURE OF INVENTION

It is an object of the invention to provide a memory device which operates with low power consumption, has high reliability of the stored data, and is small-size, light-weight and inexpensive, and a driving method thereof. Further, it is an object of the invention to provide a semiconductor device which operates with low power consumption, has high reliability of the stored data and a long distance of radio frequency communication, and is small-size, light-weight and inexpensive, and a driving method thereof.

The following means is taken in the invention in order to solve the foregoing problem.

According to a driving method of a memory device of the invention, voltage is applied at plural times to a memory element having a first conductive layer, a second conductive layer, and an organic compound layer sandwiched between the first conductive layer and the second conductive layer to change the electrical property of the memory element.

In addition, according to a driving method of a memory device of the invention, a voltage is applied at plural times between a gate electrode of a memory element having a semiconductor film including two impurity regions, the gate electrode, and a gate insulating film, and at least one of the two impurity regions to change the electrical property of the memory element. Here, according to the driving method of the memory device of the invention, the memory element stores whether the conductivity of at least one of the semiconductor film or the gate insulating film is changed or not.

According to a driving method of a memory device of the invention, a voltage is applied at plural times to a memory element having a first conductive layer and a second conductive layer surrounded by an insulating film on a semiconductor region including two impurity regions, between the first conductive layer and at least one of the two impurity regions in the semiconductor region to change the electrical property of the memory element.

According to the driving method of a memory device of the invention, applying a voltage at plural times means to apply a first voltage and then apply a second voltage which is increased stepwise.

According to a memory device of the invention, a memory cell array in which memory elements are arranged in matrix and a writing circuit are included. The memory element has a first conductive layer, a second conductive layer, and an organic compound layer sandwiched between the first conductive layer and the second conductive layer, and the writing circuit includes a voltage generating circuit for generating a voltage in order to apply to the memory element at plural times, and a timing controlling circuit for controlling an output of the voltage.

According to a memory device of the invention, a memory cell array in which memory cells are arranged in matrix and a writing circuit are included. The memory cell has a transistor and a memory element, the memory element has a first conductive layer, a second conductive layer, and an organic compound layer sandwiched between the first conductive layer and the second conductive layer, and the writing circuit includes a voltage generating circuit for generating a voltage in order to apply to the memory element at plural times, and a timing controlling circuit for controlling an output of the voltage.

In addition, the memory element included in the memory device of the invention stores whether the conductivity of the organic compound layer is changed or not.

In addition, the memory element included in the memory device of the invention stores whether the conductivity of the organic compound layer is changed irreversibly from low to high or not.

According to a memory device of the invention, a memory cell array in which memory elements are arranged in matrix and a writing circuit are included. The memory element has a semiconductor film including two impurity regions, a gate electrode, and a gate insulating film, and the writing circuit includes a voltage generating circuit for generating a voltage in order to apply to the memory element at plural times, and a timing controlling circuit for controlling an output of the voltage.

According to a memory device of the invention, a memory cell array in which memory cells are arranged in matrix and a writing circuit are included. The memory cell has a transistor and a memory element, the memory element has a semiconductor film including two impurity regions, a gate electrode, and a gate insulating film, and the writing circuit includes a voltage generating circuit for generating a voltage in order to apply to the memory element at plural times, and a timing controlling circuit for controlling an output of the voltage.

According to the memory device of the invention, the memory element stores whether the conductivity of at least one of the semiconductor film or the gate insulating film is changed or not.

According to a memory device of the invention, a memory cell array in which memory elements are arranged in matrix and a writing circuit are included. The memory element has a first conductive layer and a second conductive layer surrounded by an insulating film on a semiconductor region including two impurity regions, and the writing circuit includes a voltage generating circuit for generating a voltage in order to apply to the memory element at plural times, and a timing controlling circuit for controlling an output of the voltage.

According to a memory device of the invention, a memory cell array in which memory cells are arranged in matrix and a writing circuit are included. The memory cell has a transistor and a memory element, the memory element has a first conductive layer and a second conductive layer surrounded by an insulating film on a semiconductor region including two impurity regions, and the writing circuit includes a voltage generating circuit for generating a voltage in order to apply to the memory element at plural times, and a timing controlling circuit for controlling an output of the voltage.

In addition, the voltage generating circuit included in the memory device of the invention has a function of generating a first voltage and a second voltage which is higher than the first voltage and the timing controlling circuit has a function of generating a first pulse having the first voltage and a second pulse having the second voltage continuously.

In addition, the memory cell array and the writing circuit included in the memory device of the invention are provided over a glass substrate or a flexible substrate.

In addition, the writing circuit included in the memory device of the invention includes a thin film transistor.

According to a driving method of a semiconductor device of the invention, a nonvolatile memory and an antenna or a wire for connecting a wire are included. The nonvolatile memory includes a memory element structured by a first conductive layer, a second conductive layer, and an organic compound layer sandwiched between the first conductive layer and the second conductive layer, and a voltage is applied to the memory element at plural times to change the electronic property of the memory element.

According to a driving method of a semiconductor device of the invention, a nonvolatile memory and an antenna or a wire for connecting a wire are included. The nonvolatile memory includes a memory element structured by a semiconductor layer including two impurity regions, a gate electrode, and a gate insulating film, and a voltage is applied to the memory element at plural times to change the electronic property of the memory element.

According to the driving method of a semiconductor device of the invention, the memory element stores whether the conductivity of at least one of the semiconductor film or the gate insulating film is changed or not.

According to a driving method of a semiconductor device of the invention, a nonvolatile memory and an antenna or a wire for connecting a wire are included. The nonvolatile memory includes a memory element structured by a first conductive layer and a second conductive layer surrounded by an insulating film on a semiconductor layer including two impurity regions, and a voltage is applied to the memory element at plural times to change the electronic property of the memory element.

According to the driving method of a semiconductor device of the invention, applying a voltage at plural times means to apply a first voltage and then apply a second voltage which is increased stepwise.

According to a semiconductor device of the invention, a controlling circuit, a nonvolatile memory, and an antenna or a wire for connecting a wire are included. The controlling circuit has a function of controlling the nonvolatile memory, and the nonvolatile memory includes memory elements arranged in matrix and a writing circuit. The memory element has a first conductive layer, a second conductive layer, and an organic compound layer sandwiched between the first conductive layer and the second conductive layer, and the writing circuit includes a voltage generating circuit for generating a voltage in order to apply to the memory element at plural times, and a timing controlling circuit for controlling an output of the voltage.

According to a semiconductor device of the invention, a controlling circuit, a nonvolatile memory, and an antenna or a wire for connecting a wire are included. The controlling circuit has a function of controlling the nonvolatile memory, and the nonvolatile memory includes memory cells arranged in matrix and a writing circuit. The memory cell has a transistor and a memory element, the memory element has a first conductive layer, a second conductive layer, and an organic compound layer sandwiched between the first conductive layer and the second conductive layer, and the writing circuit includes a voltage generating circuit for generating a voltage in order to apply to the memory element at plural times, and a timing controlling circuit for controlling an output of the voltage.

In addition, the memory element included in the semiconductor device of the invention stores whether the conductivity of the organic compound layer is changed or not.

In addition, for example, the memory element included in the semiconductor device of the invention stores whether the conductivity of the organic compound layer is changed irreversibly from low to high or not.

According to a semiconductor device of the invention, a controlling circuit, a nonvolatile memory, and an antenna or a wire for connecting a wire are included. The controlling circuit has a function of controlling the nonvolatile memory, and the nonvolatile memory includes memory elements arranged in matrix and a writing circuit. The memory element has a semiconductor film including two impurity regions, a gate electrode, and a gate insulating film, and the writing circuit includes a voltage generating circuit for generating a voltage in order to apply to the memory element at plural times, and a timing controlling circuit for controlling an output of the voltage.

According to a semiconductor device of the invention, a controlling circuit, a nonvolatile memory, and an antenna or a wire for connecting a wire are included. The controlling circuit has a function of controlling the nonvolatile memory, and the nonvolatile memory includes a memory cell array in which memory cells arranged in matrix and a writing circuit. The memory cell has a transistor and a memory element, the memory element has a semiconductor film having two impurity regions, a gate electrode, and a gate insulating film, and the writing circuit includes a voltage generating circuit for generating a voltage in order to apply to the memory element at plural times, and a timing controlling circuit for controlling an output of the voltage.

According to the semiconductor device of the invention, the memory element stores whether the conductivity of at least one of the semiconductor film or the gate insulating film is changed or not.

According to a semiconductor device of the invention, a controlling circuit, a nonvolatile memory, and an antenna or a wire for connecting a wire are included. The controlling circuit has a function of controlling the nonvolatile memory, and the nonvolatile memory includes memory elements arranged in matrix and a writing circuit. The memory element has a first conductive layer and a second conductive layer surrounded by an insulating film on a semiconductor region including two impurity regions, and the writing circuit includes a voltage generating circuit for generating a voltage in order to apply to the memory element at plural times, and a timing controlling circuit for controlling an output of the voltage.

According to a semiconductor device of the invention, a controlling circuit, a nonvolatile memory, and an antenna or a wire for connecting a wire are included. The controlling circuit has a function of controlling the nonvolatile memory, and the nonvolatile memory includes a memory cell array in which memory cells arranged in matrix and a writing circuit. The memory cell has a transistor and a memory element, the memory element has a first conductive layer and a second conductive layer surrounded by an insulating film on a semiconductor region including two impurity regions, and the writing circuit includes a voltage generating circuit for generating a voltage in order to apply to the memory element at plural times, and a timing controlling circuit for controlling an output of the voltage.

In addition, the voltage generating circuit included in the semiconductor device of the invention has a function of generating a first voltage and a second voltage which is higher than the first voltage and the timing controlling circuit has a function of generating a first pulse having the first voltage and a second pulse having the second voltage continuously.

In addition, the memory cell array and the writing circuit included in the semiconductor device of the invention are provided over a glass substrate or a flexible substrate.

In addition, the writing circuit included in the semiconductor device of the invention comprises a thin film transistor.

The memory device of the invention has a memory element structured by a conductor and an organic compound as one mode or has a memory element of which structure is the same as a transistor as another mode thereby it can be manufactured easily over an inexpensive substrate such as glass by low-temperature process. Further, the memory device of the invention can perform writing with low power consumption by applying a voltage at plural times to the memory element. Consequently, a circuit area can be reduced. In addition, writing by applying a voltage at plural times can make the amount of conductivity change of a plurality of memory elements uniform. Accordingly, a memory device that the variations can be reduced and the reliability is high can be provided.

Furthermore, by incorporating the above-described memory device in a semiconductor device which communicates by noncontact means and employing a writing method of applying a voltage at plural times, a semiconductor device which has high reliability, and is small-size, light-weight, and inexpensive can be provided. In addition, by operating the semiconductor device with low power consumption, a distance of radio frequency communication between a reader/writer and the semiconductor device can be extended. In addition, writing can be surely performed by one writing operation.

BEST MODE FOR CARRYING OUT THE INVENTION

Figure 1:
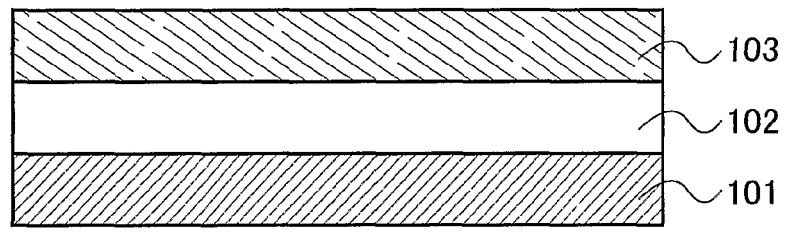
FIG. 1 is a diagram describing a structure of a memory element of a memory device of the invention.

Although the invention will be described below by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that identical portions in structures of the invention described hereinafter may be denoted by the same reference numerals in the drawings.

(Emobodiment Mode 1)

Described in this embodiment mode is a memory device including a memory element containing an organic matter. FIG. 1 shows a structure of a memory element included in a memory device of the invention. The memory element is structured by a first conductive layer 101, a second conductive layer 103, and an organic compound layer 102 sandwiched between the first conductive layer 101 and the second conductive layer 103. For materials of the first conductive layer 101 and the second conductive layer 103, an element, a compound, or the like having high conductivity is used. For a material of the organic compound layer 102, an organic compound whose conductivity is changed by electric action is used; in this embodiment mode, an organic compound which has diode-characteristics at an initial state and has high conductivity after a high voltage has been applied is used. The memory element having the above-described structure changes its conductivity between before and after voltage has been applied, therefore, a binary of "an initial state" and "after the conductivity is changed" can be stored.

Figure 2:
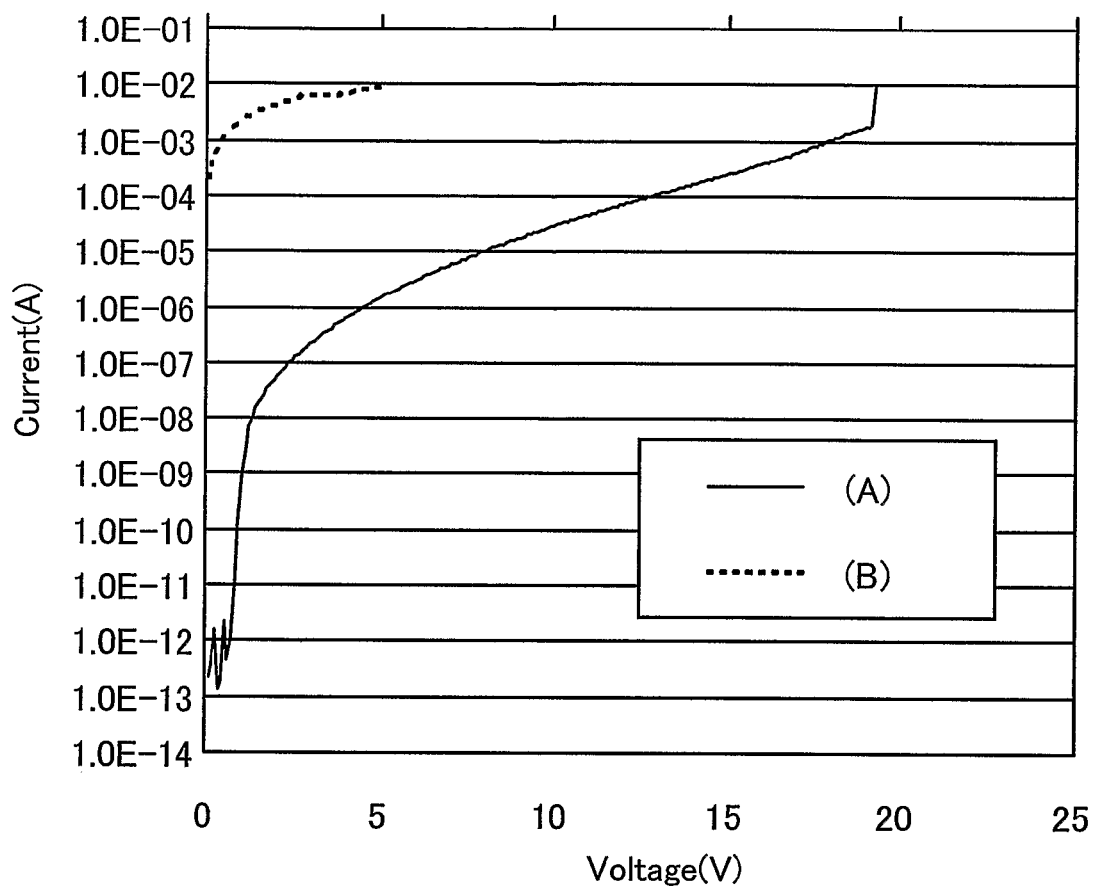
FIG. 2 shows current-voltage characteristics of the memory element before and after voltage has been applied.

Respective current-voltage characteristics (hereinafter referred to as "I-V characteristics") of the memory element before and after voltage has been applied are shown in FIG. 2. The first conductive layer of the memory element is formed of indium tin oxide (hereinafter referred to as "ITSO") containing silicon, the organic compound layer thereof is formed of bis[N-(1-naphthyl)-N-phenyl]benzidine (hereinafter referred to as "NPB") with a thickness of 50 nm, and the second conductive layer thereof is formed of aluminum (Al), and size of the memory element is 100 μm×100 μm. Here, the size of the memory element means the size of a surface where the first conductive layer is in contact with the layer which functions as a memory (e.g., the organic compound layer). FIG. 2 shows I-V characteristics (A) when voltage has been applied gradually from 0 V to 20 V to the memory element at the initial state and I-V characteristics (B) of the memory element after the voltage has been applied. As for the I-V characteristics (A) of the memory element at the initial state, it was found that the current value was suddenly increased at a voltage of about 19 V and the conductivity thereof was changed. As for the I-V characteristics (B) of the memory element after the voltage was applied, the current value was drastically increased in comparison with that at the initial state. In addition, conductivity change was also found when a pulse voltage of 20 V for 10 msecs was applied to the memory element at the initial state.

From the similar experiments performed to memory elements having various structures, it was found that a voltage when the conductivity of a memory element is changed depends on the size of the memory element, a method of applying voltage, the thickness, the size, a material of an organic compound layer, and the like. For example, when the size of the memory element having the above-described structure was 20 μm×20 μm, the conductivity did not change at a voltage lower than 20 V. In addition, when the thickness of the organic compound layer of the memory element having the above-described structure was 10 nm and voltage was applied from 0 V gradually or continuously, the conductivity was changed at a voltage of 10 V. Furthermore, it was found that in the case where a pulse voltage is applied to a memory element, the conductivity thereof is changed by applying a voltage higher than the above-described case by 0 to several voltages, for 0.1 to 100 msecs.

From the above-described results, it was found that a voltage required for changing the conductivity increased as the size of the memory element became smaller, the voltage required for changing the conductivity increased in the case of applying a pulse voltage in comparison with the case of applying voltage gradually, and the voltage required for changing the conductivity decreased as the thickness of the organic compound layer became thinner.

Figure 3:
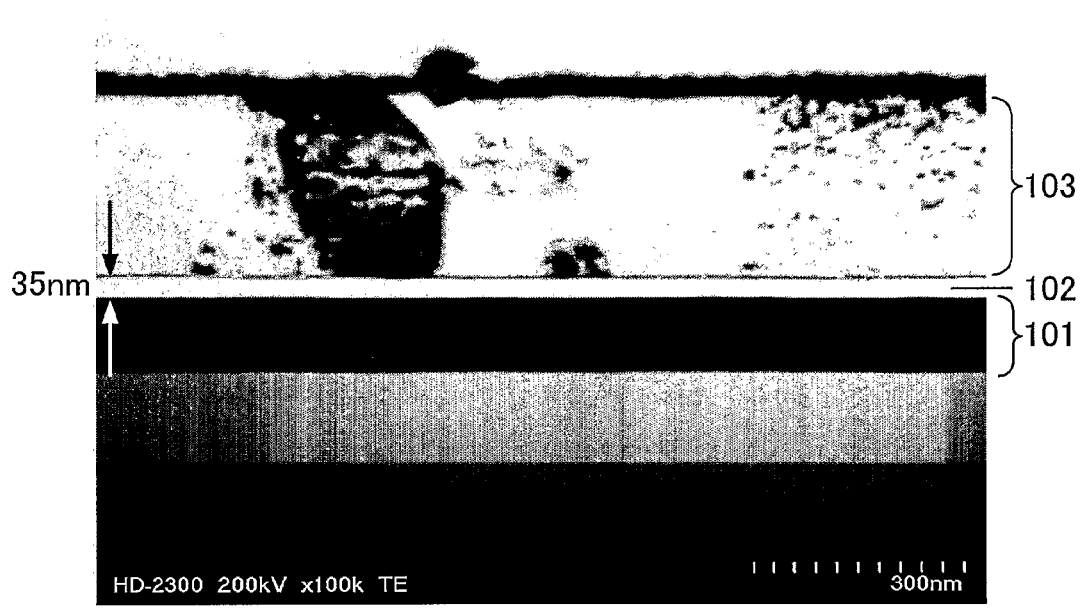
FIG. 3 is a cross-sectional view of the memory element before voltage has been applied.
Figure 4:
FIG. 4 is a cross-sectional view of the memory element after voltage has been applied.

Here, a cross-sectional image of the memory element before voltage has been applied is shown in FIG. 3 while a cross-sectional image of the memory element after the voltage has been applied is shown in FIG. 4. The cross-sectional images are photographed by a transmission electron microscope (TEM). As for the memory element, the first conductive layer 101 is formed of ITO with a thickness of 110 nm, the organic compound layer 102 is formed of N,N'-diphenylN,N-bis(3-methylphenyl)-1,1'-biphenyl-4,4'-diamine (hereinafter referred to as "TPD") with a thickness of 35 nm, and the second conductive layer 103 is formed of aluminum with a thickness of 270 nm. The organic compound layer 102 before the voltage has been applied shown in FIG. 3 has uniform thickness while the organic compound layer 102 after the voltage has been applied shown in FIG. 4 has nonuniform thickness. In this manner, it was confirmed that the organic compound layer of the memory element of which conductivity is changed by applying voltage has a region where the thickness is 15 nm or less.

From the above-described measurement results, a mechanism for changing conductivity of a memory element is considered as follows. First, heat may be generated when voltage is applied to the memory element to flow current to the organic compound layer. Then, when the temperature of the organic compound rises to a glass transition point, the organic compound may turn into a rubber and flow so that the thickness becomes nonuniform. The first conductive layer and the second conductive layer may be shorted at a portion where the thickness is particularly thin of the organic compound layer so that the conductivity of the memory element may be increased.

In addition, the heat generated in the organic compound layer may be scattered and lost from the surrounding insulating layer or conductive layer. At this time, the temperature becomes the most highest at the center of the organic compound layer because the heat release is difficult to occur. Therefore, in a large-size memory element, the temperature tends to increase and the conductivity thereof may be changed by a lower voltage in comparison with a small-size memory element.

In view of the above-described mechanism, a method for changing conductivity of a memory element efficiently can be presented. According to one of the method, two levels of a voltage value, namely a first voltage and a second voltage are applied to the memory element. More preferably, the first voltage and the second voltage are applied continually. Here, the first voltage is preferably as large as not to change conductivity of the organic compound and the second voltage is preferably larger than the first voltage and as large as to reach the temperature of the organic compound to the glass transition point. Further alternatively, three or more levels of a voltage value may be applied to the memory element. The first voltage as large as not to change conductivity of the organic compound is applied first, then a voltage as large as to reach the temperature of the organic compound to the glass transition point is applied, and then a voltage for supplying energy equivalent to the heat discharge from the organic compound is applied. In this case also, the voltages are preferably applied continuously.

By applying several levels of a voltage value such as two levels or three levels of a voltage value as described above, the heat generated in the memory element can be difficult to be scattered and lost, therefore, conductivity of a memory element can be changed by applying a low voltage for a short period even if the size is small. In addition, by applying voltage as described above, current consumption during writing can be reduced and a period when the current consumption is the highest can be shortened, therefore, the voltage generating circuit included in the writing circuit, and the memory device can be downsized.

Moreover, if a high pulse voltage is applied to the memory element, the amount of change of the conductivity is varied and the reliability of the memory device is reduced. However, by applying a plurality levels of a voltage value as in the invention, preferably applying continuously, the amount of change of the conductivity of the memory element becomes stable and the reliability of the memory device can be improved.

Furthermore, since an organic compound is used for a material of the memory element, the invention can be manufactured over a glass substrate or a flexible substrate by low-temperature process so that an inexpensive memory device can be provided. Such a glass substrate or a flexible substrate may be large so that the memory device can be manufactured at low cost.

(Embodiment Mode 2)

Described in the embodiment mode are constitution of a memory device of the invention and a method of writing data thereof.

Figure 5:
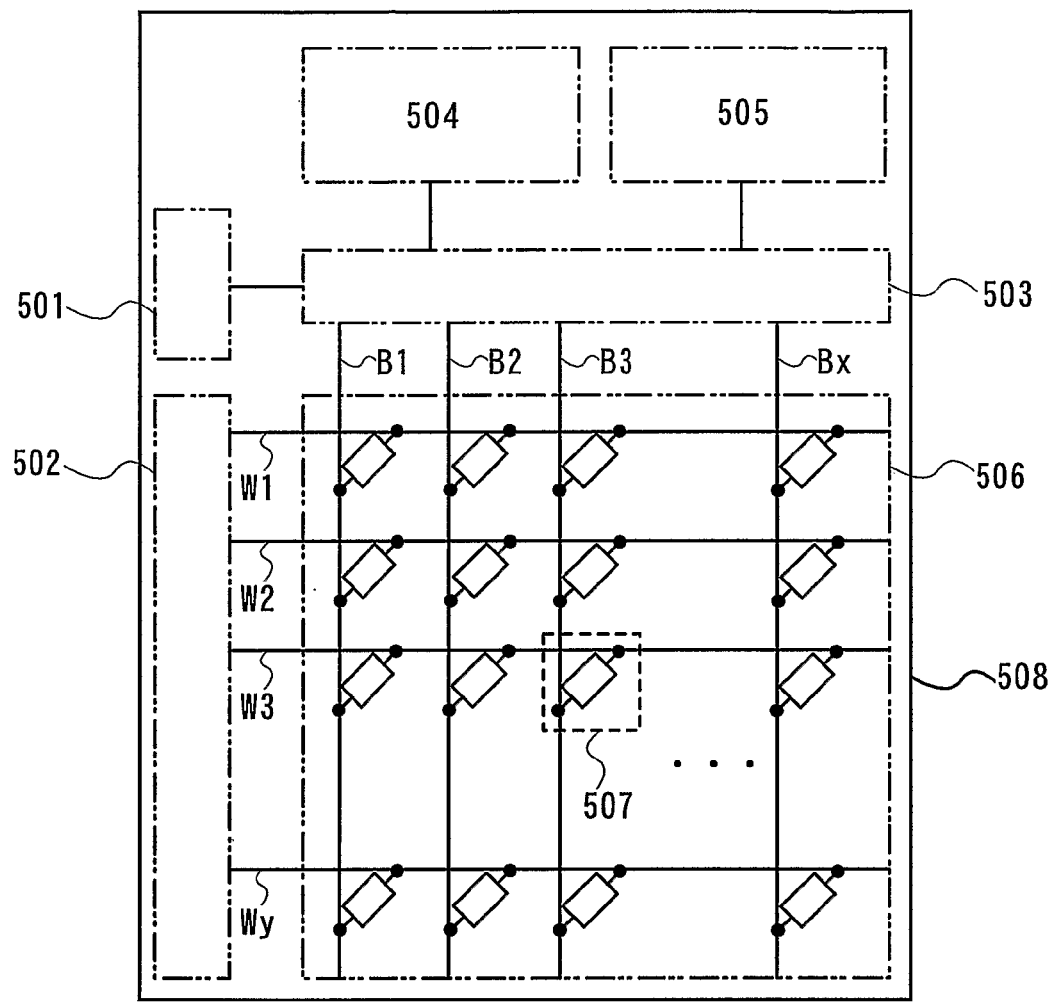
FIG. 5 is a diagram describing constitution of a memory device of the invention.

Constitution of a memory device of the invention is shown in FIG. 5. A memory device 508 of the invention includes a column decoder 501, a row decoder 502, a reading circuit 504, a writing circuit 505, a selector 503, and a memory cell array 506. The memory cell array 506 has x×y numbers of memory cells 507 at intersection points each between a bit line Bm ($1 \le m \le x$) and a word line Wn ($1 \le n \le y$).

The column decoder 501 receives address signals for specifying a row of the memory cell array, and a signal is supplied to the selector 503 of the specified row. The selector 503 receives the signal from the column decoder 501 to select a bit line of the specified row. The row decoder 502 receives an address signal for specifying a column of the memory cell array to select a word line of the specified column. According to the above-described operation, one memory cell 507 corresponding to the address signals is selected. The reading circuit 504 reads data stored in the selected memory cell to amplify and output it. The writing circuit 505 generates a voltage required for writing and applies the voltage to a memory element in a selected memory cell to perform data writing.

Figure 6A:
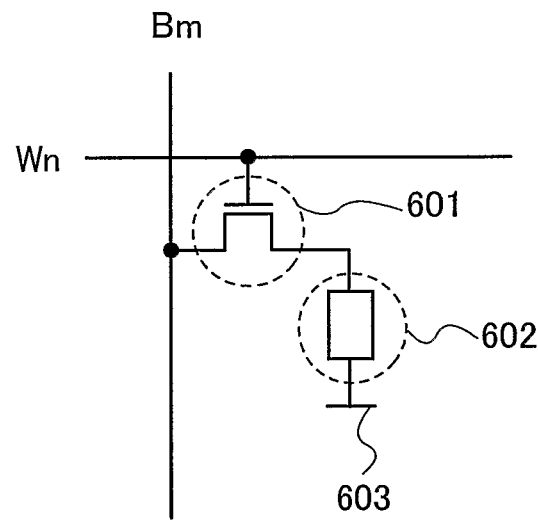
FIGS. 6A and 6B are diagrams each describing a configuration of a memory cell of a memory device of the invention.

As shown in FIG. 6A, a memory cell includes a transistor 601 and a memory element 602. As for the transistor 601, a gate electrode is connected to a word line, one high concentration impurity region is connected to a bit line, and the other high concentration impurity region is connected to a first conductive layer of the memory element 602. A second conductive layer of the memory element 602 is electrically connected to second conductive layers of all memory elements in the memory cell array, to which a certain voltage is applied when the memory device is operated, that is when writing and when reading. The second conductive layer having such a structure may be referred to as a common electrode 603 in this specification.

Figure 7:
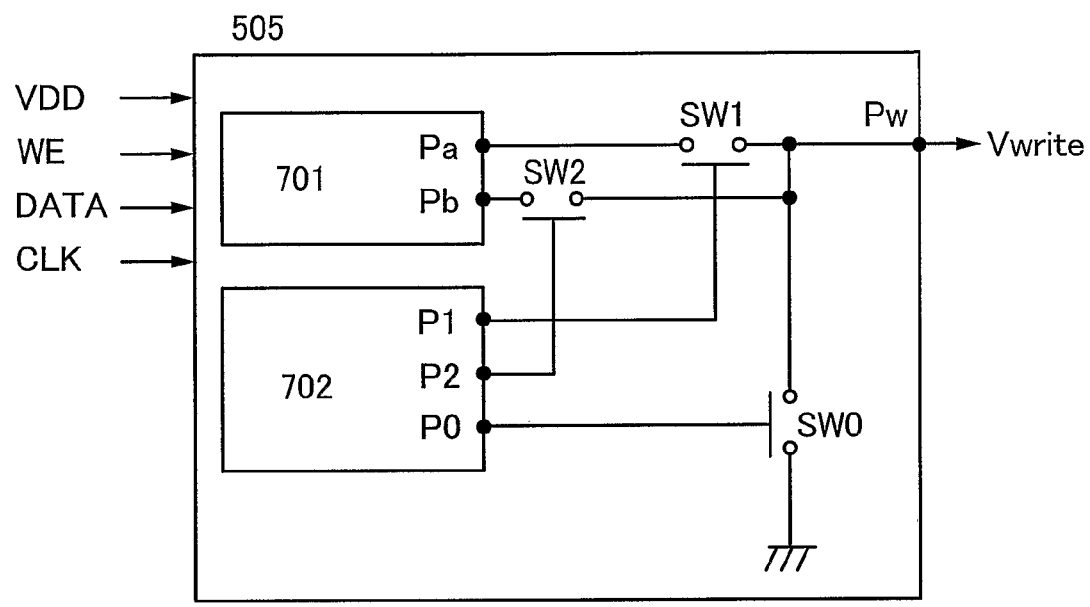
FIG. 7 is a diagram describing constitution of a writing circuit of a memory device of the invention.

FIG. 7 shows constitution of the writing circuit 505 of the memory device of the invention. The writing circuit 505 comprises a voltage generating circuit 701, a timing controlling circuit 702, switches SW0, SW1, and SW2, and an output terminal Pw. The voltage generating circuit 701 comprises a voltage step-up circuit or the like, which generates voltages V1 and V2 required for writing and outputs them from outputs Pa and Pb respectively. The timing controlling circuit 702 generates signals S0, S1, and S2 for controlling the switches SW0, SW1, and SW2 respectively from a write controlling signal (hereinafter referred to as "WE"), a data signal (hereinafter referred to as "DATA"), a clock signal (hereinafter referred to as "CLK"), and the like. Connection between an output of the voltage generating circuit and a voltage source which is a standard within the memory device is switched. The voltage source which is a standard here is a standard within the memory device, which can be referred to as "ground", "a fixed potential", or the like; it is mainly referred to as "ground" in this specification. In addition, Pa and an output of the voltage generating circuit are connected by SW1 while Pb and the output of the voltage generating circuit are connected by SW2, thereby Vwrite of the output of the voltage generating circuit is switched. Here, the switches SW0 to SW2 are not connected at the same time.

Next, a writing operation is described. As for the writing, there are a writing that changes conductivity of a memory element and a writing that does not change the conductivity. In this specification, the case where the conductivity of the memory element is changed is denoted by a writing of "1" while the case where the conductivity of the memory element is not changed is denoted by a writing of "0".

Figure 8:
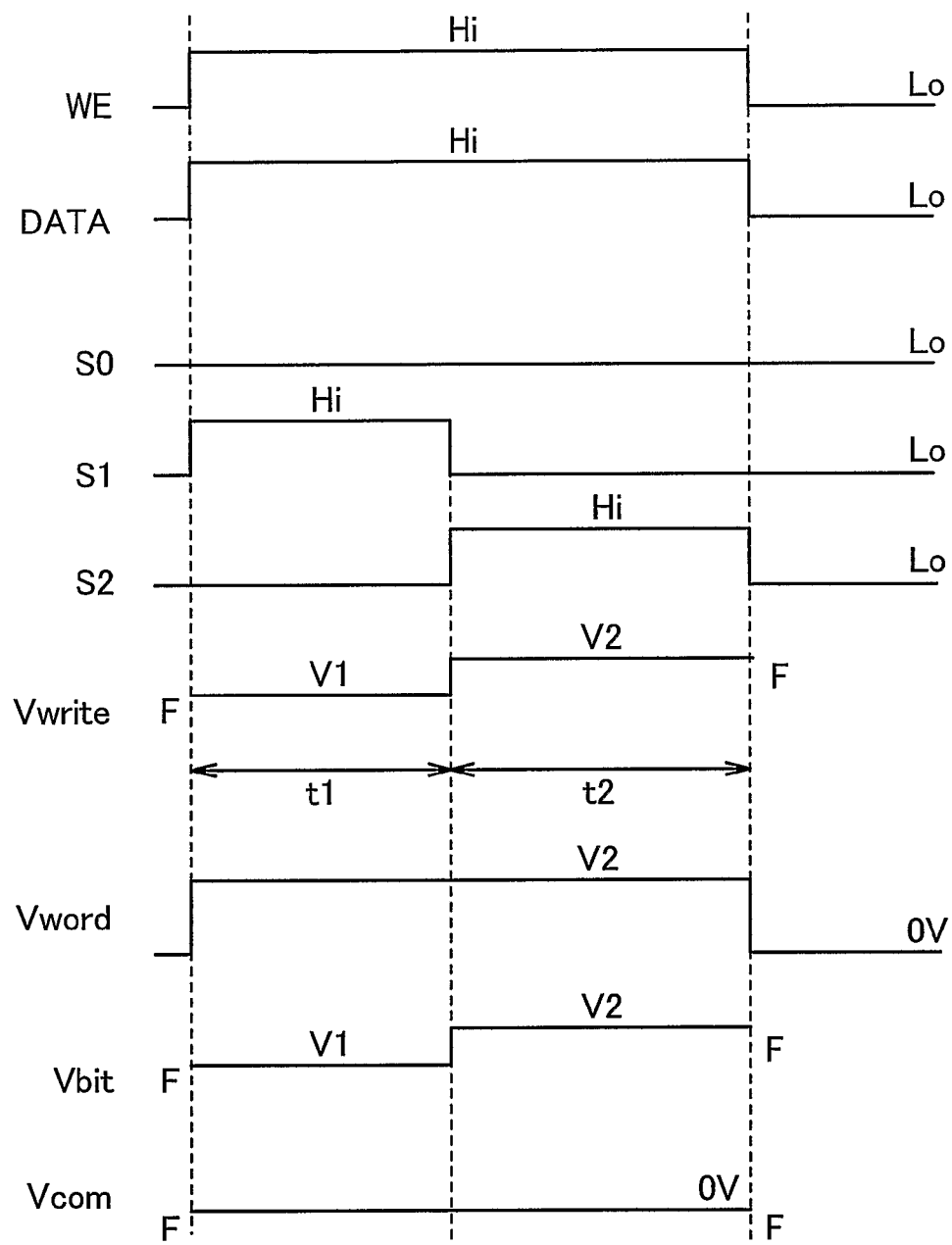
FIG. 8 is a timing chart describing a writing.

FIG. 8 shows a timing chart for describing a writing of "1". The timing chart shows respective timings of external input signals WE and DATA, output signals S0, S1, and S2 of the timing controlling circuit 702, an output voltage Vwrite of the writing circuit, and voltages Vbit, Vword, and Vcom applied to a selected memory cell. The input signal WE represents writing nonrecognition when a voltage thereof is low (hereinafter referred to as "Lo") while represents writing recognition when the voltage is high (hereinafter referred to as "Hi"). The input signal DATA represents "1" when it is Hi while represents "0" when it is Lo. The output signals S0, S1, and S2 control respective switches to be OFF when they are Lo while to be ON when they are Hi. In addition, the applied voltage Vbit represents a voltage applied to a bit line, Vword represents a voltage applied to a word line, and Vcom represents a voltage applied to a common electrode.

Writing is performed as follows. First, when the input signal WE becomes Hi, the column decoder 501 which receives an address signal for specifying a row supplies a signal to a selector of the specified row, and the selector 503 connects a bit line of the selected row to the output Pw of the writing circuit. The other bit lines which are not selected are in the state of nonconnection (hereinafter referred to as "floating"). Similarly, the row decoder 502 which receives an address signal for specifying a column applies a voltage V2 to a word line of the specified column while applies a voltage of 0 V to the other word lines which are not selected. As a result of the above-described operation, one memory cell 507 corresponding to the address signals is selected. 0 V is applied to the common electrode here.

At the same time, an input signal DATA=Hi is received, and the voltage generating circuit 701 generates voltages V1 and V2 to output through the outputs Pa and Pb. The timing controlling circuit 702 generates the signals S0, S1, and S2 for controlling respective switches from the input signals WE, DATA, CLK, or the like to output through the outputs P0, P1, and P2. The switches SW0, SW1, and SW2 are switched by the above-described signals, and the writing circuit outputs the voltages V1 and V2 continuously through the output Pw.

In the selected memory cell, according to the above-described operation, the voltage V2 is applied to the word line, V1 and V2 which are two levels of a voltage value are continuously applied to the bit line, and 0 V is applied to the common electrode. At this time, it is set that V1<V2 is satisfied. Consequently, two high concentration impurity regions of a transistor are electrically connected and the voltage of the bit line is applied to the first conductive layer of the memory element, and the conductivity of the memory element is changed so that "1" is stored.

When the input signal WE becomes Lo, all word lines become 0 V, and all bit lines and the common electrode become in the floating state. In the timing controlling circuit, the signals S0, S1, and S2 generate Lo respectively to output from the outputs P0, P1, and P2 so that the output Pw of the writing circuit becomes in the floating state. The writing operation is stopped by the above-described operation. A floating state is denoted by F in FIG. 8.

For example, in the case of the memory element described in Embodiment Mode 1 where the first conductive layer is formed of ITO, the organic compound layer is formed of NPB with a thickness of 50 nm, the second conductive layer is formed of aluminum, and the size is 100 μm×100 μm, the writing operation can be performed by that, where a period for applying the voltage V1 is referred to as t1 and a period for applying the voltage V2 is referred to as t2, V1=10 V, V2=19 V, and t1=t2=5 msecs.

Figure 9:
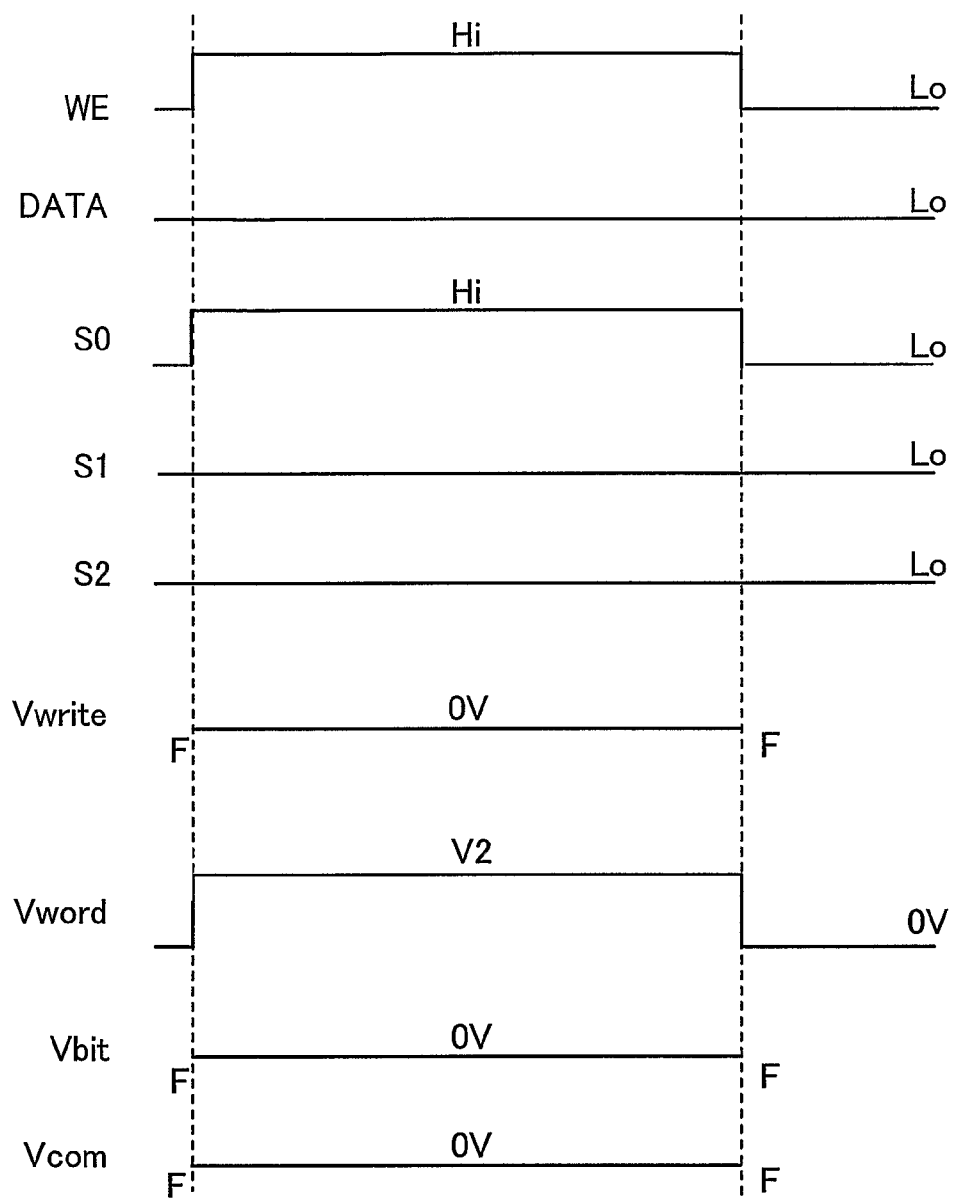
FIG. 9 is a timing chart describing a writing.

Next, FIG. 9 shows a timing chart for describing a writing of "0". The timing chart shows, similarly to FIG. 8, respective timings of the input signals WE and DATA, the output signals S0, S1, and S2, the output voltage Vwrite, and the applied voltages Vbit, Vword, and Vcom. The writing of "0" is a writing that does not change the conductivity of the memory element, which can be achieved by applying no voltage to the memory element. Described in this embodiment mode is a method of applying 0 V to a bit line and a common electrode.

First, similarly to the writing of "1", when the input signal WE becomes Hi, the column decoder 501 which receives an address signal for specifying a row supplies a signal to a selector of the specified row, and the selector 503 connects a bit line of the selected row to the output Pw of the writing circuit. The other bit lines which are not selected are in the floating state. Similarly, the row decoder 502 which receives an address signal for specifying a column applies a voltage V2 to a word line of the specified column while applies a voltage of 0 V to the other word lines which are not selected. As a result of the above-described operation, one memory cell 507 corresponding to the address signals is selected. 0 V is applied to the common electrode here.

At the same time, an input signal DATA=Lo is received, and the timing generating circuit 702 generates control signals S0=Hi, S1=Lo, and S2=Lo to output through the outputs P0, P1, and P2 respectively. The switch SW0 is turned ON while the switches SW1 and SW2 are turned OFF by the above-described signals, and the writing circuit outputs 0 V from the output Pw.

In the selected memory cell, according to the above-described operation, the voltage V2 is applied to the word line, and 0 V is applied to the bit line and the common electrode. Consequently, no voltage is applied to the memory element and the conductivity thereof does not change so that "0" is stored.

When the input signal WE becomes Lo, all word lines become 0 V, and all bit lines and the common electrode become in the floating state. At the same time, in the timing controlling circuit, the signals S0, S1, and S2 generate Lo respectively to output from the outputs P0, P1, and P2 so that the output of the writing circuit becomes in the floating state.

According to the constitution and means of the invention, even in the case of a small-size memory element, conductivity thereof can be changed by applying a low voltage for a short voltage applying period. In addition, as for a voltage step-up circuit included in the writing circuit, the circuit area and power consumption are both reduced as a voltage to be generated becomes smaller. In addition, according to the invention, therefore, current consumption when writing can be reduced and a period of the maximum current consumption can be shortened, thereby the voltage generating circuit included in the writing circuit and the memory device can be downsized. In addition, if a high pulse voltage is applied to a memory element, the amount of conductivity change varies so that the reliability of a memory device is reduced. However, by applying a plurality of levels of a voltage continuously according to the invention, the amount of conductivity change of the memory element becomes uniform so that the reliability of the memory device can be improved.

It is to be noted that this embodiment mode can be freely combined with the above-described Embodiment Mode 1 to implement.

(Embodiment Mode 3)

Described in this embodiment mode is a semiconductor device in which at least a controlling circuit, a nonvolatile memory, and an antenna are included and performs transmitting and receiving data by radio frequency.

Figure 10:
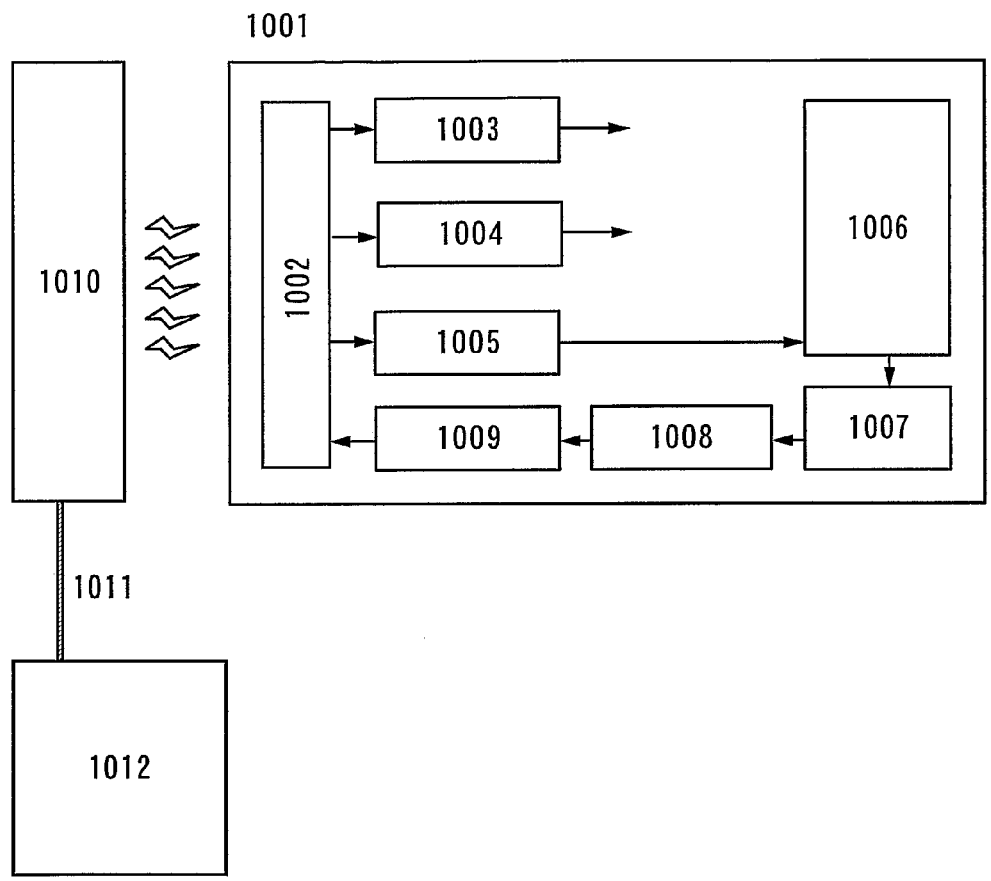
FIG. 10 is a diagram describing an constitution example of a semiconductor device of the invention.

Constitution of a semiconductor device of the invention is shown in FIG. 10.

A semiconductor device 1001 includes a resonant circuit 1002 comprising an antenna and a resonance capacitor, a power supply circuit 1003, a clock generating circuit 1004, a demodulating circuit 1005, a controlling circuit 1006, a nonvolatile memory 1007, an encoding circuit 1008, and a modulating circuit 1009. The semiconductor device is not limited to the above-described constitution, and a central processing unit (CPU), a congestion controlling circuit, or the like may be included. In addition, the semiconductor device 1001 may have only a wire for connecting an antenna; in this case, when the semiconductor device is used, an antenna which is manufactured separately is connected to the wire.

The semiconductor device 1001 of the invention receives power supply from an electromagnetic wave transmitted by a reader/writer 1010 to perform transmitting and receiving data to/from the reader/writer 1010 by radio frequency. The reader/writer 1010 is connected to a computer 1012 via a communication line 1011, which performs power supply to the semiconductor device 1001 and data transmission and reception to/from the semiconductor device 1001 based on the control of the computer 1012.

The resonant circuit 1002 receives an electromagnetic wave transmitted from the reader/writer 1010 to generate an induced voltage. This induced voltage functions as power of the semiconductor device 1001, and besides, contains data transmitted from the reader/writer 1010. The power supply circuit 1003 rectifies the induced voltage generated in the resonant circuit 1002 by a diode, stabilizes by a capacitor, and supplies it to each circuit. The clock generating circuit 1004 generates a clock signal having a necessary frequency based on the induced voltage generated in the resonant circuit 1002. The demodulating circuit 1005 demodulates data from the induced voltage generated in the resonant circuit. The controlling circuit 1006 controls the nonvolatile memory 1007. Here, in addition to generation of a memory control signal, a data judging circuit for reading data from the reader/writer 1010, or the like is included. The nonvolatile memory 1007 holds specific data of the semiconductor device 1001. The nonvolatile memory here is the memory device described in Embodiment Mode 2. The encoding circuit 1008 converts the data stored in the nonvolatile memory 1007 into an encoded signal. The modulating circuit 1009 modulates a carrier based on the encoded signal.

Described in this embodiment mode is a case where the semiconductor device receives power supply from the reader/writer, however, the invention is not limited to this mode. In other words, the semiconductor device may perform power supply by a battery provided therein and transmit/receive data to/from the reader/writer by radio frequency.

Figure 6B:
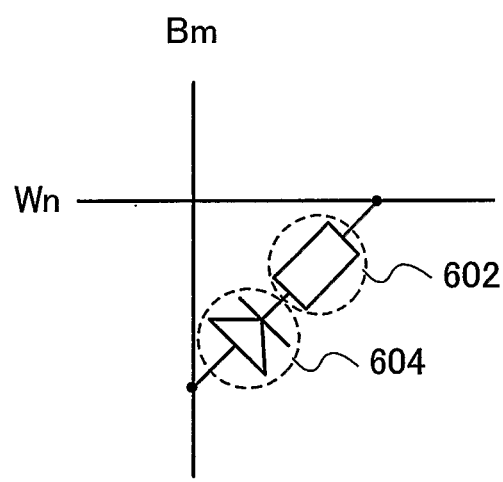

Described next is the nonvolatile memory included in the semiconductor device of the invention. The memory device described in Embodiment Mode 2 is applied to the nonvolatile memory, and the nonvolatile memory has the constitution shown in FIG. 5. FIGS. 6A and 6B show configurations of a memory cell of the nonvolatile memory. A memory cell shown in FIG. 6A is a memory cell of the memory device described in Embodiment Mode 2. A memory cell shown in FIG. 6B includes a memory element 602 and a rectifying element 604. The memory cell can be manufactured by stacking an organic compound layer and a layer having a rectifying function between a layer forming a bit line and a layer forming a word line. In addition, the memory cell can also be manufactured using an organic compound which shows different diode-characteristics between before and after voltage has been applied, by a memory element in which a layer of the organic compound is provided between conductive layers. The nonvolatile memory included in the semiconductor device of the invention may have either configuration of FIG. 6A or FIG. 6B. The memory element 602 has a diode-characteristics at the initial state and the conductivity becomes high irreversibly when voltage has been applied. According to the memory element of the invention, writing of "1" is performed by applying a plurality of levels of a voltage continuously.

The writing circuit included in the memory device described in Embodiment Mode 2 is applied to the nonvolatile memory (FIG. 7). Therefore, the writing operation performed by the memory device described in Embodiment Mode 2 is applied to operations of writing "1" and "0" to the memory cell shown in FIG. 6A. (FIG. 8 and FIG. 9).

Even in the case of a small-size memory element, by applying a plurality of levels of a voltage continuously to the memory element, conductivity thereof can be changed by applying a low voltage for a short voltage applying period. In addition, according to the means of the invention, current consumption when writing can be reduced and a period of the maximum current consumption can be shortened, thereby the voltage generating circuit included in the writing circuit and the semiconductor device can be downsized. In addition, if a high pulse voltage is applied to a memory element, the amount of conductivity change varies so that the reliability of a semiconductor device is reduced. However, by applying a plurality of levels of a voltage continuously according to the invention, the amount of conductivity change of the memory element becomes uniform so that the reliability of the semiconductor device can be improved. Furthermore, since an organic compound is used for a material of the memory element, the invention can be manufactured over a large glass substrate or a flexible substrate by low-temperature process so that an inexpensive semiconductor device can be provided.

It is to be noted that this embodiment mode can be freely combined with the above-described Embodiment Mode 1 and Embodiment Mode 2 to implement.

(Embodiment 1)

In this embodiment, a configuration of a memory cell different from Embodiment Mode 2 is described. The configuration of a memory cell is shown in FIG. 6B. The memory cell includes the memory element 602 and the rectifying element 604. The memory cell can be manufactured by stacking an organic compound layer and a layer having a rectifying function between a layer forming a bit line and a layer forming a word line. In addition, the memory cell can also be manufactured using an organic compound which shows different diode-characteristics between before and after voltage has been applied, by a memory element in which a layer of the organic compound is provided between conductive layers.

An operation of writing "1" into the memory cell shown in FIG. 6B is described. Here, FIG. 5 is applied to constitution of a memory device while FIG. 7 is applied to constitution of a writing circuit. According to the invention, a plurality of levels of a voltage is continuously applied to change the conductivity. In this embodiment, writing is performed into a memory cell which is specified at the m-th row and the n-th column ($1 \leq m \leq x$, $1 \leq n \leq y$) within memory cells.

Figure 11:
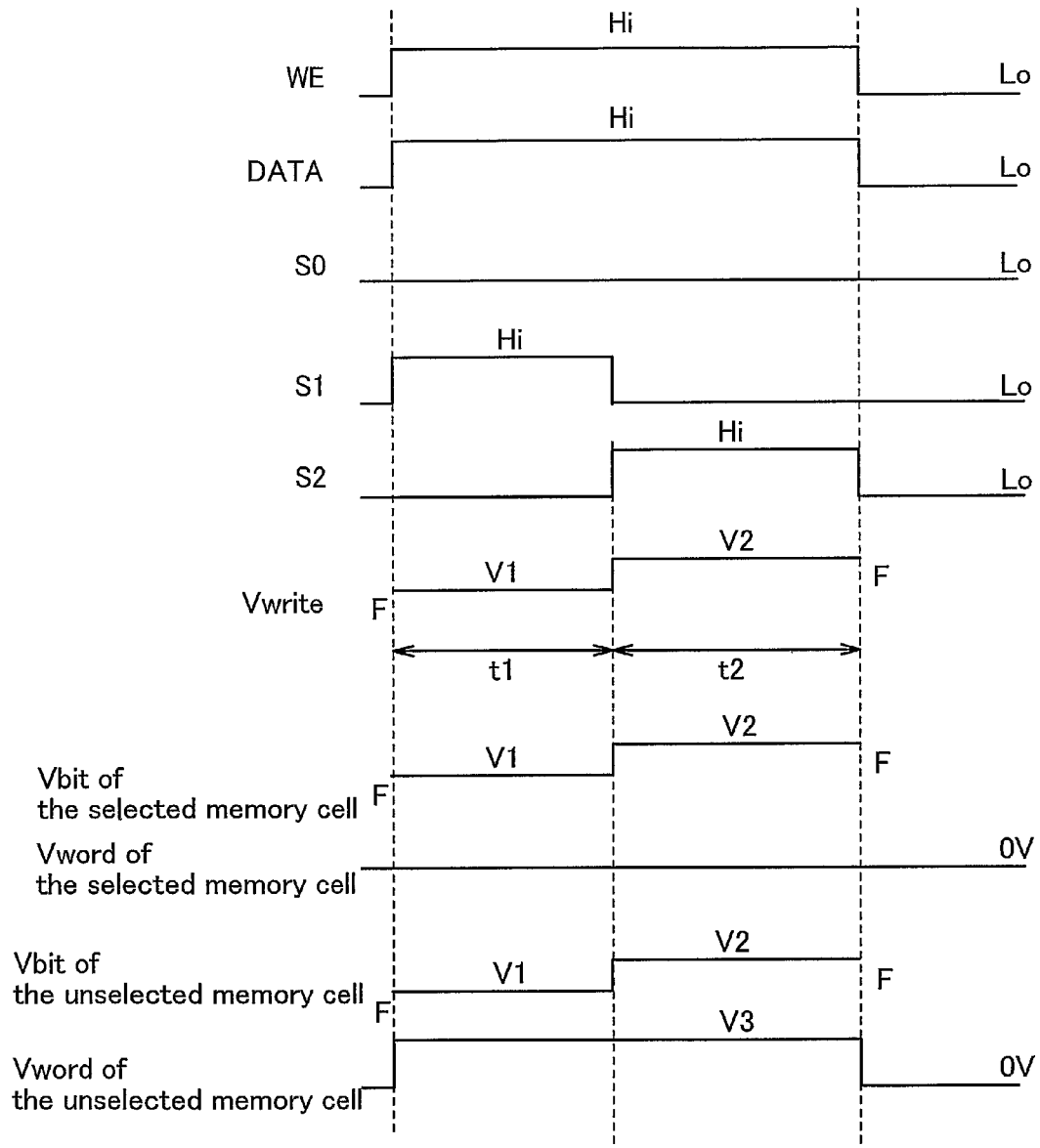
FIG. 11 is an example of a timing chart for writing.

Next, FIG. 11 shows a timing chart for describing a writing of "1". The timing chart shows respective timings of the input signals WE and DATA, the output signals S0, S1, and S2, the output voltage Vwrite, and the applied voltages Vbit and Vword which are applied to the memory cell of the m-th row and the n-th column.

As for the memory cell of this embodiment, a first conductive layer is formed of a word line and a second conductive layer is formed of a bit line. Therefore, it is necessary to consider not to mistakenly write into a memory cell of the m-th row and the a-th column ($1 \leq a \leq y$, $a \neq n$) connected to a bit line Bm. The timing chart also shows applied voltages Vbit and Vword of the unselected memory cell of the m-th row and the a-th column.

The writing is performed as follows. First, when the input signals WE and DATA become Hi, the voltage generating circuit 701 generates voltage V1 and V2 and outputs them through the outputs Pa and Pb. The timing controlling circuit 702 generates signals S0, S1, and S2 for controlling switches from the input signals WE, DATA, CLK, or the like and outputs through the outputs P0, P1, and P2. The switches SW0, SW1, and SW2 are switched by the signals, so that the writing circuit outputs the voltage V1 and V2 continuously through the output Pw.

The column decoder 501 which receives an address signal for specifying a row supplies a signal to a selector of the m-th row and the selector 503 connects the bit line Bm of the m-th row to the output Pw of the writing circuit. The other bit lines which are not selected are in the floating state. Similarly, the row decoder 502 which receives an address signal for specifying a column makes a voltage of a word line Wn of the n-th column 0 V while applies a voltage V3 to the other word lines Wa which are not selected. The voltage V3 is determined in the range where the conductivity of the memory element does not change even if a difference V4 between the voltage V1 and V3 and a difference V5 between the voltage V2 and V3 are applied.

According to the above-described operation, 0 V is applied to the word line Wn while the voltages V1 and V2 are applied to the bit line Bm continuously. Consequently, the conductivity of the memory element is changed so that "1" is stored in the memory cell of the m-th row and the n-th column. At the same time, V3 is applied to the word line Wa and V1 and V2 are applied to the bit line Bm continuously. Consequently, the voltage V4 and the voltage V5 are applied to the memory element continuously to control so that writing is not performed to the memory cell.

When the input signal WE becomes Lo, all word lines become 0 V and all bit lines become in the floating state. In the timing controlling circuit, at the same time, the signals S0, S1, and S2 generate Lo respectively to output from the outputs P0, P1, and P2 so that the output Pw of the writing circuit becomes in the floating state. The writing operation is completed by the above-described operation.

Even in the case of a small-size memory element, by applying a plurality of levels of a voltage continuously to the memory element, conductivity thereof can be changed by applying a low voltage for a short voltage applying period. In addition, according to the means of the invention, current consumption when writing can be reduced and a period of the maximum current consumption can be shortened, thereby the voltage generating circuit included in the writing circuit and the memory device can be downsized. In addition, if a high pulse voltage is applied to a memory element, the amount of conductivity change varies so that the reliability of a memory device is reduced. However, by applying a plurality of levels of a voltage continuously according to the invention, the amount of conductivity change of the memory element becomes uniform so that the reliability of the memory device can be improved.

It is to be noted that this embodiment can be freely combined with the above-described Embodiment Modes 1 to 3 to implement.

(Embodiment Mode 2)

In this embodiment, a writing method of a memory device which is different from Embodiment Mode 2 is described. According to a writing of the invention, a plurality of levels of a voltage is applied continuously to a memory element to change the conductivity of the memory element. Therefore, when n is an integral number of 2 or more, a writing circuit in the memory device of the invention includes a voltage generating circuit for generating n levels of a voltage V1 to Vn and a timing controlling circuit for controlling such that the n levels of a voltage are continuously outputted. In addition, the voltages V1 to Vn are applied to the memory element continuously for applying periods t1 to tn so that the conductivity is changed. If the invention is implemented, the integral number n, the voltage Vn, and the applying period tn are determined considering the size of the memory element, the film thickness and a material of the organic compound layer, or the like. The integral number n is preferably about 2 to 5.

Next, an applied voltage for writing is described. Described in Embodiment Mode 2 is the method in which the positive voltages V1 and V2 are continuously applied to the first conductive layer of the memory element while 0 V is applied to the second conductive layer thereof. However, the invention is not limited to the above-described embodiment mode, and the writing can be performed using a negative voltage as well. Specifically, there is a method in which the positive voltages V1 and V2 are applied to the first conductive layer continuously while a negative voltage Vm is applied to the second conductive layer. Here, the voltage V1 may be 0 V. Besides, there is a method in which the positive voltage V1 is applied to the first conductive layer while negative voltages Vm and Vn are applied continuously to the second conductive layer. Here, the voltage V1 may be 0 V while the voltages Vm and Vn may be negative voltages. Alternatively, the voltage V1 may be a positive voltage, the voltage Vm may be 0 V, and the voltage Vn may be a negative voltage here. That is, a plurality of levels of a potential difference is supplied between the first conductive layer and the second conductive layer of the memory element by using a positive voltage and a negative voltage so that writing is performed to the memory element.

Writing by using a negative voltage as described above has an advantage in that a circuit area can be reduced. This is because the writing circuit includes a voltage step-up circuit for generating a positive voltage and a voltage step-down circuit for generating a negative voltage, and respective areas of the voltage step-up circuit and the voltage step-down circuit increase in proportion to respective absolute values of voltages to be generated. It is for example provided that an area of the writing circuit when the positive voltages V1 and V2 are applied to the first conductive layer while 0 V is applied to the second conductive layer is S1 whereas an area of the writing circuit when 0 V and the positive voltage V1 are applied to the first conductive layer while the negative voltage Vm is applied to the second conductive layer is S2. Since $|V1|+|Vm|=|V2|$ is satisfied in the case of the writing using the negative voltage Vm, $|Vm|<|V2|$ is satisfied so that the area S2 becomes smaller than the area S1.

Furthermore, as for the voltage step-up circuit and the voltage step-down circuit, power consumption thereof becomes smaller as an absolute value of a voltage to be generated based on a signal received from an antenna becomes smaller. Therefore, power consumption can be reduced by applying the invention in which writing is performed to a memory element at a plurality of levels. Furthermore, by combining a voltage step-up circuit and a voltage step-down circuit as described above, the absolute value of a voltage to be generated based on a signal received from the antenna is reduced so that the power consumption can be further reduced.

Next, a method of applying a writing voltage is described. Described in Embodiment Mode 2 is the method of applying the voltages V1 and V2 which satisfy $|V1|<|V2|$. However, the invention is not limited to this, and respective magnitudes of voltages V (n−1) and Vn can be set arbitrarily in a condition where the integral number n≥2.

As described in Embodiment Mode 1, the mechanism of changing conductivity of a memory element can be considered as follows. First, when a voltage is applied at a time t1, heat is generated in the organic layer to increase temperature thereof. Next, after a time tA, the temperature of the organic compound layer reaches a glass transition point and a flow starts. After a time tB then, the conductivity is changed. Here, heat radiation occurs always during the voltage is applied.

In view of the above-described mechanism, a data writing is desirably performed as follows.

(A) during a period from the time t0 to the time tA, voltage is applied step-by-step in order to make heat radiation from the organic compound layer difficult, so that the temperature of the organic compound layer is increased step-by-step.

(B) during a period from the time tA to the time tB, a voltage corresponding to the same amount of energy as heat radiation is applied in order to keep the temperature of the glass transition point.

For example, where a certain time between the times t0 and tA is tC, an applied voltage in a period from t0 to tC is V1, an applied voltage in a period from tC to tA is V2, and an applied voltage in a period from tA to tB is V3, the heights of the voltages can satisfy $|V1|<|V2|>|V3|$.

In addition, in this case also, a plurality of levels of a potential difference can be applied to the memory element by using a negative voltage to perform the writing.

Even in the case of a small-size memory element, by applying a plurality of levels of a voltage continuously to the memory element, conductivity thereof can be changed by applying a low voltage for a short voltage applying period. In addition, according to the means of the invention, current consumption when writing can be reduced and a period of the maximum current consumption can be shortened, thereby the voltage generating circuit included in the writing circuit and the memory device can be downsized. In addition, if a high pulse voltage has been applied to a memory element, the amount of conductivity change varies so that the reliability of a memory device is reduced. However, by applying a plurality of levels of a voltage continuously according to the invention, the amount of conductivity change of the memory element becomes uniform so that the reliability of the memory device can be improved.

It is to be noted that this embodiment can be freely combined with the above-described Embodiment Modes 1 to 3 and Embodiment 1 to implement.

(Embodiment 3)

Figure 12:
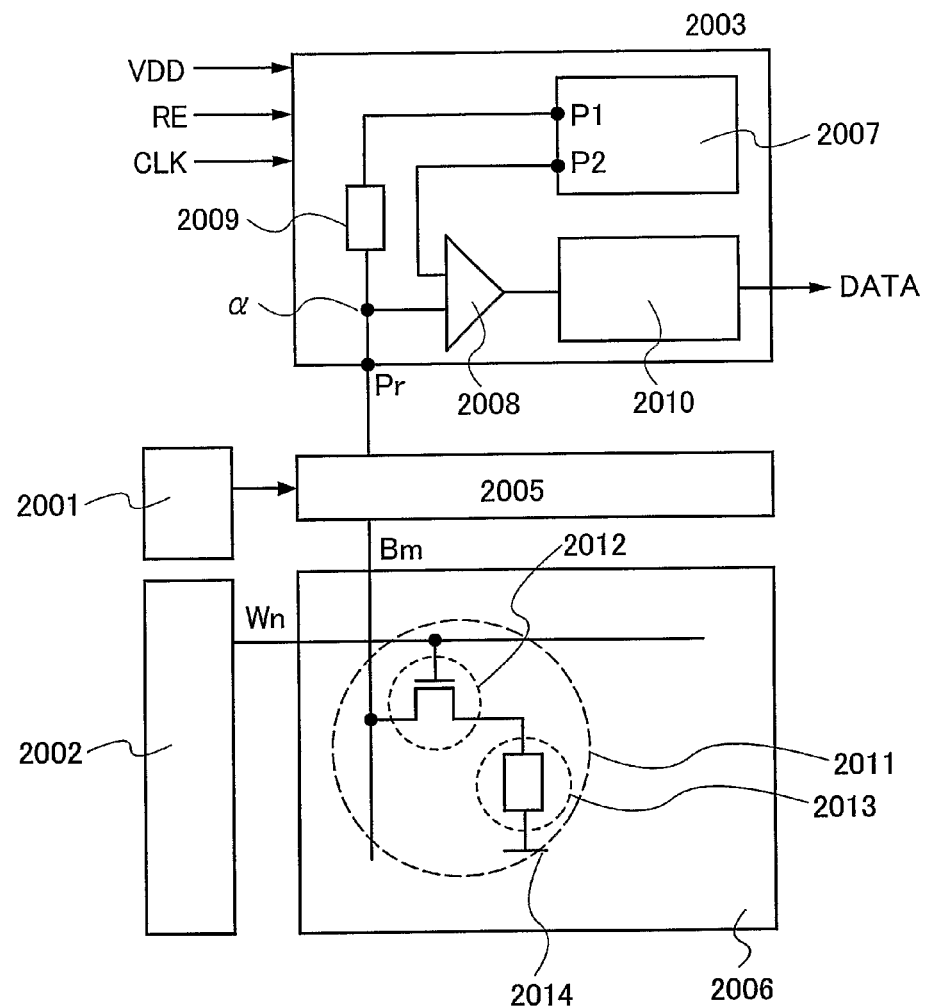
FIG. 12 is a diagram describing a reading circuit of a memory device of the invention.

Described in this embodiment, a data reading is described. In FIG. 12, a memory device in which a necessary portion for describing the reading is picked up is shown. The memory device includes a column decoder 2001, a row decoder 2002, a reading circuit 2003, a selector 2005, and a memory cell array 2006. The memory cell array 2006 has a bit line Bm (1≤m≤x), a word line Wn (1≤n≤y), and x×y numbers of memory cells 2011 at intersection points each between the bit line Bm and the word line Wn. The memory cell 2011 includes a transistor 2012, a memory element 2013, and a common electrode 2014. The reading circuit 2003 includes a voltage generating circuit 2007, a sense amplifier 2008, a resistor 2009, a data outputting circuit 2010, and input/output terminal Pr, and a point for inputting to the sense amplifier 2008 from between the resistor 2009 and the input/output terminal Pr is denoted by α.

The voltage generating circuit 2007 generates voltages Vread and Vref required for a reading operation and outputs them from P1 and P2 respectively. The data reading uses a low voltage, therefore, a power source voltage (VDD) can be used for the voltage Vread. The voltage Vref is a voltage lower than the voltage Vread, which is generated by dividing resistance of the power source voltage and a ground voltage. Therefore, the voltage generating circuit 2007 included in the reading circuit 2003 has a configuration different from the voltage generating circuit included in the writing circuit. The sense amplifier 2008 compares the voltage at the point α and the voltage Vref and outputs a result thereof. The data outputting circuit 2010 is controlled by a reading controlling signal (hereinafter referred to as "RE"), receives data of a memory cell from an output of the sense amplifier 2008, and outputs the data after amplifying that.

Described next is an operation of reading data of the memory cell 2011 of the m-th column and the n-th row. First, the column decoder 2001 which receives an address signal for specifying a column supplies a signal to a selector of the m-th column and the selector 2003 connects a bit line Bm of the m-th column to the input/output terminal Pw of the writing circuit. The other bit lines which are not selected are in the floating state. Similarly, the row decoder 502 which receives an address signal for specifying a row applies the voltage Vread to a word line Wn of the n-th row while applies 0 V to the other unselected word lines. At the same time, the voltages Vread and Vref are outputted from the outputs P1 and P2 of the voltage generating circuit 2007, and 0 V is applied to the common electrode 2014. The voltage Vread is applied to the series resistance of the resistor 2009 and the memory element 2013 according to the above-described operation, and the voltage of the point α has a value which is divided by the resistance of these two elements.

Figure 13:
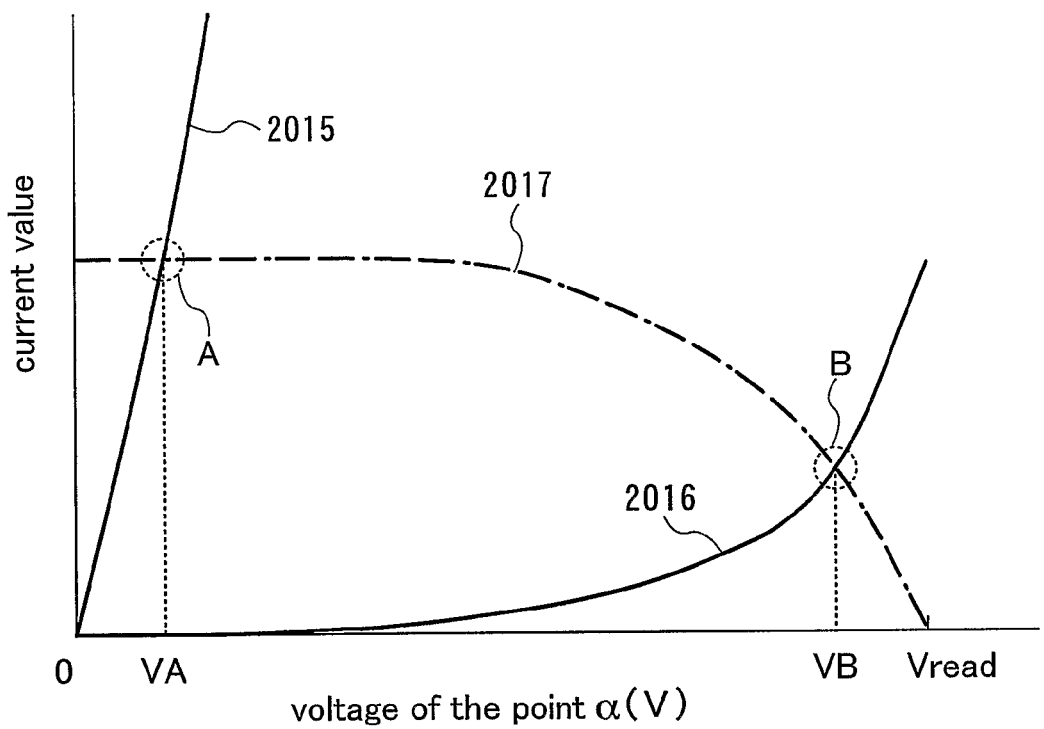
FIG. 13 shows current-voltage characteristics of a memory element and a resistor.

Here, in order to describe a possible voltage of the point α, I-V characteristics 2015 of the memory element to which a writing of "1" is performed, I-V characteristics 2016 of the memory element to which a writing of "0" is performed, and I-V characteristics 2017 of the resistor 2009 are shown in FIG. 13. The resistor 2009 is a transistor here. In addition, a horizontal axis in FIG. 13 indicates a voltage of the point α. As for the I-V characteristics 2015 of the memory element to which a writing of "1" is performed, the current value is drastically increased even if a voltage of the point α is small since the electric resistance of the memory element 2013 is small. As for the I-V characteristics 2016 of the memory cell to which a writing of "0" is performed, the current value is increased when the voltage of the point α becomes a certain value or more since the memory element 2013 shows a diode-characteristics. As for the I-V characteristics 2017 of the resistor, the current value is decreased as the voltage of the point α is increased and when the voltage of the point a becomes Vread, the current value is 0.

From FIG. 13, a voltage of the point α can be described as follows. In the case where "1" is written into the memory element 2013, the voltage of the point α is a voltage VA of a point A at an intersection of the I-V characteristics 2015 of the memory element to which a writing of "1" is performed and the I-V characteristics 2017 of the resistor. Meanwhile, in the case where "0" is written into the memory element 2013, the voltage of the point α is a voltage VB of a point B at an intersection of the I-V characteristics 2016 of the memory element to which a writing of "0" is performed and the I-V characteristics 2017 of the resistor.

Next, the sense amplifier 2008 compares the magnitudes of the point α and Vref to each other. Here, the voltage Vref is larger than the voltage VA and smaller than the voltage VB, which is preferably (VA+VB)/2. By setting the voltage as described above, it turns out that the voltage of the point α is the voltage VA when the sense amplifier 2008 judges that the voltage of the point α is smaller than Vref, so that "1" is written into the memory element 2013. Meanwhile, it turns out that the voltage of the point α is the voltage VB when the sense amplifier 2008 judges that the voltage of the point α is larger than Vref, so that "0" is written into the memory element 2013.

The sense amplifier outputs a signal showing "1" when the voltage of the point α is smaller than Vref while the sense amplifier outputs a signal showing "0" when the voltage of the point α is larger than Vref. The data output circuit 2010 takes data from the output signal of the sense amplifier 2008 based on a control signal RE which is externally inputted, and amplifies the data to output. Reading can be performed by the above-described operation.

The resistance of the memory element is read by replacing with the magnitude of a voltage in this embodiment, however, the invention is not limited to this to implement. For example, a method of reading the resistance of the memory element by replacing with the magnitude of a current or a method of precharging a bit line can be employed as well.

It is to be noted that this embodiment can be freely combined with the above-described Embodiment Modes 1 to 3 and Embodiments 1 and 2 to implement.

(Embodiment 4)

A memory device and a semiconductor device of the invention are mainly configured by a semiconductor element and a memory element. In this embodiment, manufacturing examples of the semiconductor element and the memory element are described with reference to cross-sectional views. The semiconductor device and the memory element are collectively referred to as an element group in this specification.

The above-described element group is manufactured over a glass substrate in this embodiment. After that, in order to provide an added value such as flexibility and light-weight properties, the element group manufactured over the glass substrate is peeled off to attach to a flexible substrate or a film in an example described here, however, the invention is not limited to this.

Figure 14A:
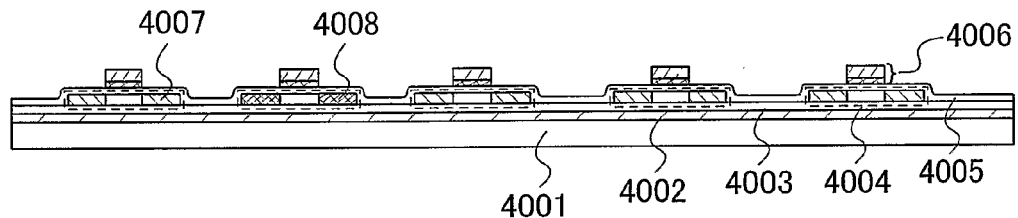
FIGS. 14A to 14C show a manufacturing example of a semiconductor element or a memory element included in a memory device or a semiconductor device of the invention.

First, a peeling layer 4002 is formed on a glass substrate 4001 (FIG. 14A). For the substrate, quartz, silicon, metal, or the like can be used as well as glass. For the peeling layer 4002, a metal, an element such as silicon, or a compound is formed entirely or partially on the substrate. It is to be noted that the peeling layer 4002 may not be formed in the case where the memory device or the semiconductor device are manufactured over the glass substrate 4001. Next, an insulating layer 4003 is formed to cover the peeling layer 4002. The insulating layer 4003 is formed of silicon oxide, silicon nitride, or the like. Then, a semiconductor layer 4004 which is formed on the insulating layer 4003 is crystallized by laser crystallization, thermal crystallization using a metal catalyst, or the like, and then processed to be a desired shape. Next, a gate insulating layer 4005 is formed to cover the semiconductor layer. The gate insulating layer 4005 is formed of silicon oxide, silicon nitride, or the like.

Figure 14B:
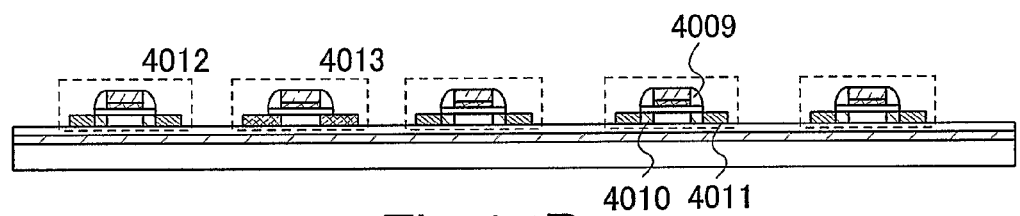

Subsequently, a gate electrode layer 4006 is formed. The gate electrode layer 4006 is formed of a conductive element or compound and then processed to be a desired shape. In the case of processing the shape by a photolithography method, the gate electrode width can be shortened by etching a resist mask with plasma or the like so that the transistor performance can be improved. FIG. 14A shows a case where the gate electrode layer is formed to have a stacked structure. Next, respective impurity elements are added into the semiconductor layer 4004 so that an N-type impurity region 4007 and a P-type impurity region 4008 are formed. For the impurity region, a resist mask is formed by a photolithography method and an impurity element such as phosphorus, arsenic or boron is added. Then, an insulating layer is formed of a nitrogen compound or the like and is anisotropically etched in a vertical direction so that an insulating layer 4009 which is contact with a side surface of the gate electrode (hereinafter referred to as a "sidewall") is formed (FIG. 14B). Next, an impurity is added into the semiconductor layer having the N-type impurity region so that a first N-type impurity region 4010 which is just below the sidewall 4009 and a second N-type impurity region 4011 which has a higher impurity concentration than that of the first impurity region are formed. By the above-described steps, an N-type transistor 4012 and a P-type transistor 4013 are formed.

Figure 14C:
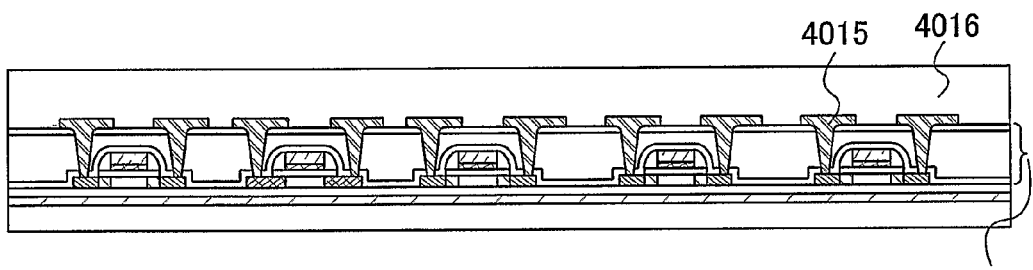

Subsequently, an insulating layer 4014 is formed to cover the N-type transistor 4012 and the P-type transistor 4013 (FIG. 14C). The insulating layer 4014 is formed of an insulating inorganic or organic compound, or the like. FIG. 14C shows a case where the insulating layer 4014 is formed to have a stacked structure. Next, contact holes are formed to expose the second N-type impurity region 4011 and the P-type impurity region 4008, a conductive layer 4015 is formed to fill the contact hole and then processed to be a desired shape. The conductive layer 4015 is formed of a conductive metal element or compound, or the like. Next, an insulating layer 4016 is formed to cover the conductive layer 4015. The insulating layer 4016 is formed of an insulating inorganic or organic compound, or the like.

Figure 15A:
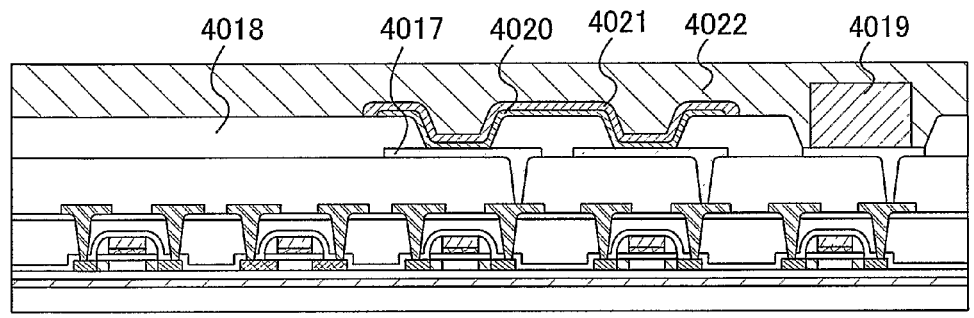
FIGS. 15A and 15B show a manufacturing example of the semiconductor element or the memory element included in the memory device or the semiconductor device of the invention.

Next, a structure of the memory element is shown in FIG. 15A. First, a contact hole is formed to expose the conductive layer 4015, a conductive layer 4017 is formed to fill the contact hole and then processed to be a desired shape. The conductive layer 4017 is formed of a conductive metal element or compound, or the like. The conductive layer 4017 corresponds to a first conductive layer of the memory element. Next, an insulating layer 4018 is formed to cover the conductive layer 4017. The insulating layer 4018 is formed of a highly-insulating inorganic or organic compound, or the like in order to electrically separate adjacent memory elements from each other. Then, a contact hole is formed to expose the conductive layer 4017. In the case of manufacturing a semiconductor device, an antenna or a wire for connecting an antenna is formed in contact with the conductive layer 4017 here. An antenna 4019 is shown in FIG. 15A. Next, an organic compound layer 4020 is formed to contact the conductive layer 4017, and then a conductive layer 4021 is formed. The organic compound layer 4020 is formed using an organic compound of which electric property is changed by applying electric action. The conductive layer 4021 is formed of a conductive metal element or compound, or the like. The conductive layer 4021 corresponds to a second conductive layer of the memory element. A passivation layer 4022 is then formed. The passivation layer 4022 is formed of an insulating compound or resin, or the like.

Figure 15B:
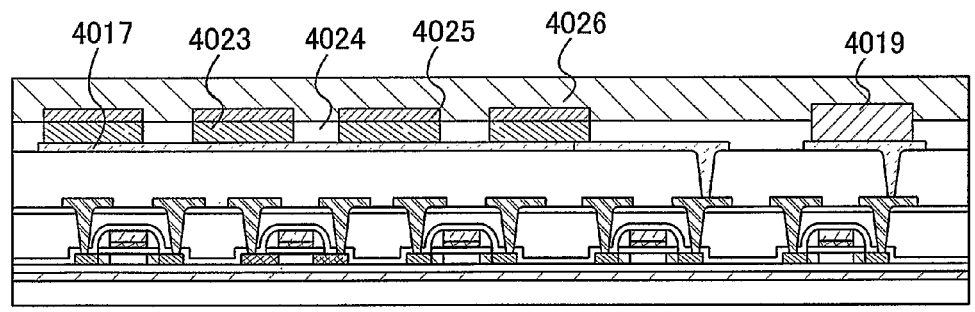

A structure of the memory element, which is different from the above-described one is shown in FIG. 15B. First, a contact hole is formed to expose the conductive layer 4015, the conductive layer 4017 is formed to fill the contact hole and then processed to be a desired shape. The conductive layer 4017 is formed of a conductive metal element or compound, or the like. The conductive layer 4017 corresponds to a first conductive layer of the memory element. In the case of manufacturing a semiconductor device, an antenna or a wire for connecting an antenna is formed in contact with the conductive layer 4017 here. The antenna 4019 is shown in FIG. 15B. Next, an organic compound layer 4023 having a desired shape is formed on the conductive layer 4017. The organic compound layer 4023 is formed using an organic compound of which electric property is changed by applying electric action. Then, an insulating layer 4024 is formed to fill a portion between the organic compound layers 4023. The insulating layer 4024 is formed of a highly-insulating inorganic or organic compound, or the like in order to electrically separate adjacent memory elements from each other. Next, a conductive layer 4025 having a desired shape is formed on the organic compound layer 4023 and the insulating layer 4024. The conductive layer 4025 is formed of a conductive metal element or compound, or the like. The conductive layer 4025 corresponds to a second conductive layer of the memory element. A passivation layer 4026 is then formed. The passivation layer 4026 is formed of an insulating compound or resin, or the like.

An insulating layer, a conductive layer, and respective layers for forming an element can be formed by a single-layer structure using a single material or a stacked-layer structure using a plurality of materials.

A semiconductor layer included in the semiconductor element manufactured by the above-described steps can be formed of any one of an amorphous semiconductor, a microcrystalline semiconductor, a microcrystal semiconductor, a polycrystalline semiconductor, an organic semiconductor, and the like. In order to obtain a semiconductor element having good characteristics, a crystalline semiconductor layer crystallized at a temperature of 200 to 600 degrees (preferably of 350 to 500 degrees) (a low-temperature polysilicon layer) or a crystalline semiconductor layer crystallized at a temperature of 600 or more degrees (a high-temperature polysilicon layer) may be used. In order to obtain a semiconductor element having further good characteristics, a semiconductor layer crystallized using a metal element as a catalyst or a semiconductor layer crystallized by laser may be used. Alternatively, a semiconductor layer formed by a plasma CVD method using a $SiH_4/F_2$ gas, a $SiH_4/H_2$ gas, or the like, or the semiconductor layer to which laser is irradiated may be used. In addition, the semiconductor layer included in the semiconductor element in a circuit has a crystal grain boundary extending parallel to the flowing direction of carriers (the channel length direction). Such a semiconductor layer can be formed using a continuous wave laser (CWLC) or a pulsed laser operating at a repetition rate of 10 MHz or more (preferably of 60 to 100 MHz).

In addition, the thickness of the semiconductor layer is preferably 20 to 200 nm (preferably 50 to 150 nm). In addition, hydrogen or halogen may be added to the semiconductor layer at a concentration of $1\times10^{19}$ to $1\times10^{22}$ atoms/cm$^3$ (preferably $1\times10^{19}$ to $5\times10^{20}$ atoms/cm$^3$) so that an active layer with few defects and in which few cracks occur, can be obtained.

The transistor manufactured as described above has an S value (subthreshold value) of 0.35 V/sec or less (preferably of 0.09 to 0.25 V/dec). In addition, the mobility thereof is preferably 10 cm$^2$/Vs or more. In addition, the transistor is a ring oscillator which is operated at a power source voltage of 3 to 5 V and has preferably an oscillating frequency of 1 MHz or more (preferably 10 MHz or more). In addition, the transistor described in this embodiment has a structure in which a semiconductor layer, a gate insulating layer, and a gate electrode layer are stacked over a substrate in this order, however, the invention is not limited to this and a structure in which a gate electrode layer, an insulating film, and a semiconductor layer are stacked in this order may be employed. In addition, the N-type transistor in this embodiment has the first N-type impurity region and the second N-type impurity region, however, the invention is not limited to this and the impurity concentration of the impurity region may be uniform.

In addition, the element group may be formed in a plurality of layers. In the case where the element group is manufactured to have a multilayer structure, a low-k material is preferably used for a material of an interlayer insulating film in order to reduce parasitic capacitance between layers. For example, a resin material such as an epoxy resin and an acrylic resin, or a compound material made of a polymerization such as a siloxane polymer may be used. If the multilayer structure with the parasitic capacitance reduced is employed, smaller area, higher-speed operation, and lower power consumption can be achieved. In addition, by providing a passivation layer for preventing contamination of an alkali metal, reliability can be improved. The passivation layer is formed of an inorganic material such as sodium nitride or a silicon nitride film, which is preferably provided so as to wrap an element in the circuit or wrap the circuit entirely.

Next, a method for peeling the element group structured as described above off the glass substrate 4001 and attaching to a flexible substrate or a film is described. In the case where the element group is peeled off the glass substrate 4001 and attached to a flexible substrate or a film, the thickness of the element group is desirably 5 μm or less (preferably 1 μm to 3 μm). In addition, in the case where a semiconductor device of the invention is structured, the area of the element group is desirably 5 mm square or less (preferably 0.3 mm square to 4 mm square).

Figure 16A:
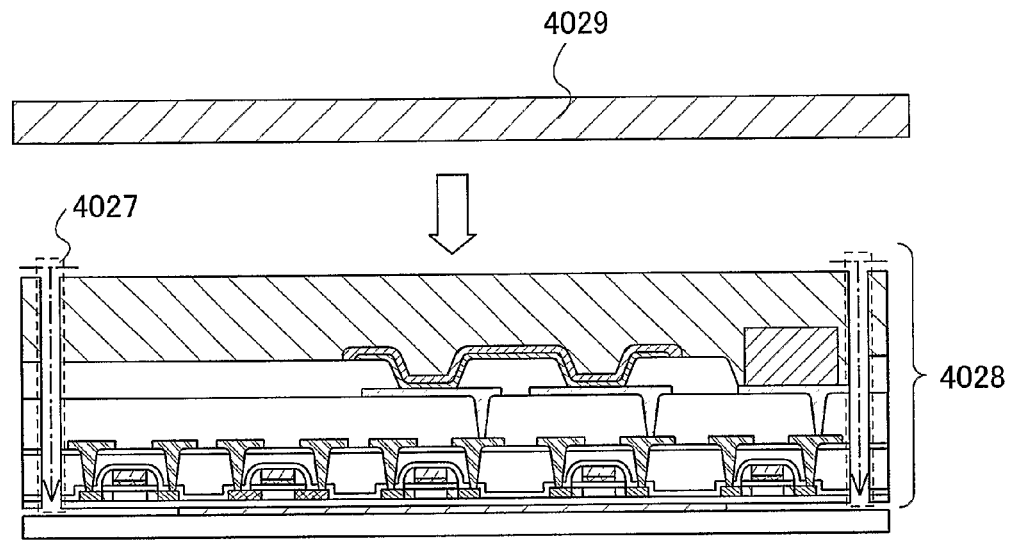
FIGS. 16A and 16B show a manufacturing example of the semiconductor element or the memory element included in the memory device or the semiconductor device of the invention.
Figure 16B:
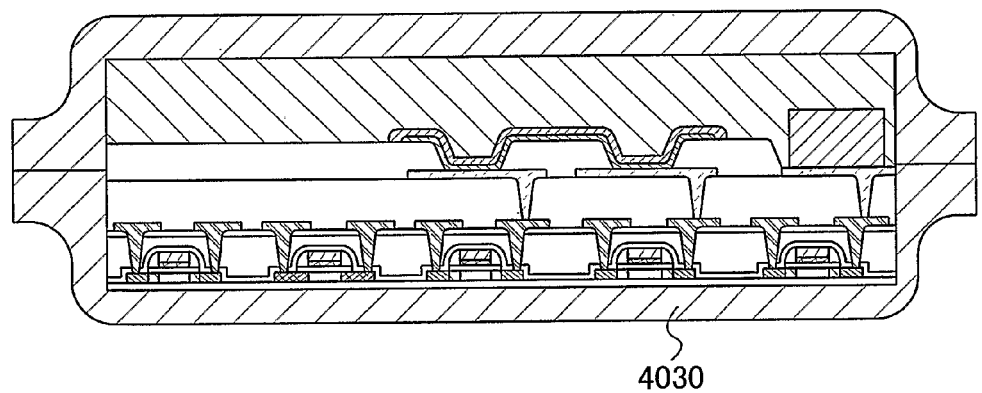

First, an opening 4027 is formed to expose the peeling layer 4002 and an etchant is injected into the opening 4027 to partially remove the peeling layer 4002 (FIG. 16A). Next, a first flexible substrate 4029 is attached to a top surface of the glass substrate, and the element group 4028 is transferred from the glass substrate 4001 to the first flexible substrate 4029 while using the peeling layer 4002 as an interface. Then, a second flexible substrate 4030 is attached to a side where the element group 4028 has contacted the glass substrate 4001 so that a flexible memory device or a semiconductor device can be manufactured (FIG. 16B). For the flexible substrate, a plastic film, paper or the like can be used. In order to minimize an effect from outside, it is desirable that the first flexible substrate 4029 and the second flexible substrate 4030 have the same thickness, and the element group 4028 exists in the middle of the cross section.

If a wire for connecting an antenna to the element group 4028 is manufactured in the above-described steps, a semiconductor device can be manufactured by manufacturing the antenna over the first flexible substrate 4029 and attaching it to the element group 4028. In addition, in the case where the element group 4028 is attached to a flexible substrate having a curved surface, the semiconductor element can be less affected when a direction of flowing carriers of the semiconductor element (the channel length direction) and a direction of the curve are the same.

In addition, in the method described in this embodiment, the element group 4028 is transferred to the first flexible substrate 4029 after the peeling layer 4002 is etched from the opening 4027, however, the invention is not limited to this. For example, there are a method in which the peeling layer 4002 is removed only by an etching step from the opening 4027 and then the element group 4028 is transferred to the flexible substrate, a method in which the first flexible substrate 4029 is attached without providing the opening 4027 to peel the element group 4028 off the glass substrate, a method in which the element group 4028 is obtained by grinding the glass substrate 4001 from its bottom surface, and the like. These methods can be combined to implement as well. If a step of transferring the element group 4028 to the flexible substrate by a method other than the method of grinding the glass substrate from its bottom surface is used, there is an advantage that the glass substrate 4001 for manufacturing the element group 4028 can be reused.

As set forth above, according to the invention, a memory element can be formed of an organic compound over a large-size glass substrate or flexible substrate by low-temperature process, and besides, the substrate can be reused so that an inexpensive semiconductor device can be provided.

Furthermore, since it can be manufactured by low-temperature process, a circuit such as a memory cell array or a writing circuit included in the semiconductor device or the memory device can be formed over the same glass substrate or flexible substrate. Accordingly, the semiconductor device or the memory device can be downsized.

It is to be noted that this embodiment can be freely combined with the above-described Embodiment Modes 1 to 3 and Embodiments 1 to 3 to implement.

(Embodiment 5)

Described in this embodiment is a manufacturing method of a memory element. The memory element is, as shown in FIG. 1, structured by the first conductive layer 101, the second conductive layer 103, and the organic compound layer 102 which is sandwiched therebetween. In this embodiment, a layer structure, a material, a manufacturing method, or the like of these three layers are described.

First, a first conductive layer is formed over a substrate. The first conductive layer is formed of a conductive material by a plasma CVD method or a sputtering method and processed to be a desired shape. For the material of the first conductive layer, there are titanium (Ti) with low electric resistance, an alloy mainly containing titanium, a titanium compound material, aluminum (Al), and the like as well as ITO described in Embodiment Mode 1. The first conductive layer is formed of one of these materials to have a single-layer structure or formed of a plurality of these materials to have a stacked-layer structure. In addition, in the case where the memory element is formed over a semiconductor element as described in Embodiment 4, it is required to consider not to adversely affect the semiconductor element which is a lower layer. Therefore, in the photolithography step for forming the first conductive layer, wet etching process is performed and hydrogen fluoride (HF) or ammonium hydrogen peroxide may be used as an etchant.

Next, an organic compound layer is formed on the first conductive layer. The organic compound layer is formed using an organic compound of which electric property is changed by applying electric action. As an example of the organic compound of which electric property is changed by applying electric action, there are an aromatic amine-based compound (that is having a bond between a benzene ring and nitrogen) such as 4,4'-bis[N-(1-naphthyl)-N-phenyl-amino]-biphenyl (abbreviated to α-NPD), 4,4',4"-tris(N,N-diphenyl-amino)-triphenylamine (abbreviated to TDATA), 4,4',4"-tris[N-(3-methylphenyl)-N-phenyl-amino]-triphenylamine (abbreviated to MTDATA), and 4,4'-bis[N- (4-(N,N-di-m-tolylamino)phenyl-N-phenylamino]biphenyl (abbreviated to DNTPD), polyvinyl carbazole (abbreviated to PVK), a phthalocyanine compound such as phthalocyanine (abbreviated to $H_2Pc$), copper phthalocyanine (abbreviated to CuPc), or vanadyl phthalocyanine (abbreviated to VOPc), or the like. The above-described organic compounds have a high hole transport property.

Furthermore, as an example of the organic compound of which electric property is changed by applying electric action, there are a material made of a metal complex or the like having a quinoline skeleton or a benzoquinoline skeleton such as tris(8-quinolinolato)aluminum (abbreviated to $Alq_3$), tris(4-methyl-8-quinoli nolato)aluminum (abbreviated to $Almq_3$), bis(10-hydroxybenzo[H]-quinolinato)beryllium (abbreviated to $BeBq_2$), or bis(2-methyl-8-quinolinolato)-4-phenylphenolato-aluminum (abbreviated to BAlq), a metal complex having a oxazole or thiazole ligand such as bis[2-(2-hydroxyphenyl)-benzoxazolate]zinc (abbreviated to $Zn(BOX)_2$), or bis[2-(2-hydroxyphenyl)benzothiazolate] zinc (abbreviated to $Zn(BTZ)_2$), and the like. Other than the metal complexes, in addition, there are 2-(4-biphenylyl)-5-(4-tert-butylphenyl)-1,3,4-oxadiazole (abbreviated to PBD), 1,3-bis[5-(p-tert-butylphenyl)-1,3,4-oxadiazole-2-yl]benzene (abbreviated to OXD-7), 3-(4-tert-butylphenyl)-4-phenyl-5-(4-biphenylyl)-1,2,4-triazole (abbreviated to TAZ), 3-(4-tert-butylphenyl)-4-(4-ethylphenyl)-5-(4-biphenylyl)-1,2,4-triazole (abbreviated to p-EtTAZ), bathophenanthroline (abbreviated to BPhen), bathocuproin (abbreviated to BCP), and the like. The above-described organic compounds have a high electron transport property.

Furthermore, as the organic compound which can be used for the material of the organic compound layer, 4-dicyanomethylene-2-methyl-6-(1,1,7,7-tetramethyljulolidine-9-enyl)-4H-pyran (abbreviated to DCJT), 4-dicyanomethylene-2-t-butyl-6-(1,1,7,7-tetramethyljulolidine-9-enyl)-4H-pyran, periflanthene, 2,5-dicyano-1,4-bis(10-methoxy-1,1,7,7-tetramethyljulolidine-9-enyl)benzene, N,N'-dimethyl-quinacridon (abbreviated to DMQd), coumarin 6, coumarin 545T, tris(8-quinolinolate)aluminum (abbreviated to Alq3), 9,9'-bianthryl, 9,10-diphenylanthracene (abbreviated to DPA), 9,10-bis(2-naphthyl)anthracene (abbreviated to DNA), 2,5,8,11-tetra-t-butylperylene (abbreviated to TBP), and the like. Furthermore, in the case where the layer is formed by dispersing the above-described material, an anthracene derivative such as 9,10-di(2-naphthyl)-2-tert-butylanthracene (abbreviated to t-BuDNA), a carbazole derivative such as bis[2-(2-hydroxyphenyl)-pyridinato]zinc (abbreviated to $Znpp_2$) or bis[2-(2-hydroxyphenyl)-benzoxazolato]zinc (abbreviated to ZnBOX), or the like can be used as a material of a main body thereof. Besides, there are tris(8-quinolinolate)aluminum (abbreviated to $Alq_3$), 9,10-bis(2-naphthyl)anthracene (abbreviated to DNA), bis(2-methyl-8-quinolinolato)-4-phenylphenolato-aluminum (abbreviated to BAlq), and the like.

The organic compound layer is formed of one of these materials to have a single-layer structure or formed of a plurality of these materials to have a stacked-layer structure.

In addition, a metal oxide, a metal nitride, or the like may be mixed into the above-described organic compound material as well. As the metal oxide, any transition metal oxide in groups 4 to 12 in the Periodic Table may be used such as vanadium oxide, molybdenum oxide, rhenium oxide, tungsten oxide, ruthenium oxide, titanium oxide, chromium oxide, zirconium oxide, hafnium oxide, and tantalum oxide. By mixing the metal oxide or the metal nitride into the organic compound material, crystallization of the organic compound layer can be suppressed so that the organic compound layer can be formed thick without increasing the resistance. By forming the organic compound layer thick, a defect due to concavity and convexity which may be caused by dust, contamination, or the like can be prevented. In addition, in the case where the memory device of the invention is provided over a flexible substrate, destruction of the memory element due to physical stress can be prevented by forming a layer of the memory element thick.

The organic compound layer is formed by a vapor deposition method, a spin coating method, an evaporation method or the like. As a forming method of the organic compound layer, there are a method in which an organic compound layer is formed to be a desired shape and a method in which an organic compound layer is formed and then processed to be a desired shape. For example, in the case where the organic compound layer to use is weak to heat or chemical action, the organic compound layer is desirably formed while processing to be a desired shape. As examples of this method, there are a method in which an organic compound layer is formed to be a desired shape using a metal mask and a method in which an organic compound layer is drawn to be a desired shape by a vapor deposition method. The metal mask is a metal board which is opened to be a desired shape. The metal board is disposed between the material and the substrate when an organic compound is deposited so that a film having the shape can be formed. In addition, the vapor deposition method means a method of forming a pattern by discharging droplets such as an ink-jet method and a dispenser method, which has an advantage in that the material is not wasted. Meanwhile, in the case where the organic compound is relatively strong to heat or chemical action, the organic compound layer can be processed to be a desired shape after it is formed. For example, there is a method in which an organic compound layer is formed by an evaporation method, a spin coating method, or the like, and then processed to be a desired shape. Film formation by a spin coating method has an advantage in that it can be performed quite easily.

Next, a second conductive layer is formed. The second conductive layer is formed of a conductive material by a sputtering method, a vapor deposition method, or the like. For the material of the second conductive layer, there are titanium (Ti) with low electric resistance, an alloy mainly containing titanium, a titanium compound material, or the like similarly to the first conductive layer, in addition to aluminum (Al) described in Embodiment Mode 1. The second conductive layer is formed of one of these materials to have a single-layer structure or formed of a plurality of these materials to have a stacked-layer structure. In addition, a light transmitting material such as indium tin oxide (ITO), indium tin oxide including silicon oxide, and indium oxide including zinc oxide can be used as well for the second conductive layer.

The second conductive layer is formed not to affect the property of the organic compound layer which is formed before. In other words, there are a method of processing to be a desired shape while forming the layer and a method of processing to be a desired shape after forming the layer, which depends on a material of the organic compound to be used. As these methods, similarly to the formation of the organic compound layer, there are an evaporation method using a metal mask, a droplet discharge method, a method of shaping after it is formed by an evaporation method or a spin coating method, or the like.

In addition, an insulating layer is provided between adjacent memory elements as described in Embodiment Mode 4. It is important for downsizing the memory device that the integration density of the memory element is increased, however, adjacent memory elements have an electrical interaction therebetween since the distance between the memory elements becomes short so that malfunction of the memory device may be caused. Therefore, it is desirable to use a quite high-insulating material for the insulating layer between the memory elements and the insulating layer is, for example, formed of an inorganic material such as oxide of silicon or nitride of silicon, an organic material such as polyimide, polyamide, benzocyclobutene, acryl, and epoxy, or the like. The insulating layer is formed of one of these materials to have a single-layer structure or formed of a plurality of these materials to have a stacked-layer structure. The insulating layer is formed by a vapor deposition method, a spin coating method, or the like. Alternatively, it may be formed by an SOG method using a material such as siloxane as well. In addition, the insulating layer has preferably a thickness of 0.75 μm to 3 μm.

The memory element included in the memory device of the invention can be manufactured by the above-described steps. The memory element has a structure in which three thin films are stacked, which can be manufactured easily. Furthermore, the memory element can be manufactured by low-temperature process using an organic compound as a material, which can be manufactured over a large-size substrate such as glass.

It is to be noted that this embodiment can be freely combined with the above-described Embodiment Modes 1 to 3 and Embodiments 1 to 3 to implement.

(Embodiment 6)

As described in the above-described embodiment modes and embodiments, a method for storing data in a memory element by applying a plurality of levels of a voltage between two electrodes can also be employed for other than an organic memory. Described in this embodiment is an example in which the above-described writing method is employed for a memory element having the same shape as a thin film transistor. First, a semiconductor device including a memory element having the same shape as a thin film transistor (hereinafter also referred to as a "TFT") is described.

As for a TFT manufactured over an insulating substrate, a channel-region of the TFT is insulated when a voltage which is higher than a normal driving voltage has been applied between a gate electrode and at least one of two impurity regions. The memory device can be constituted utilizing this; entire circuit constitution in this case is the same as FIG. 5.

Figure 17A:
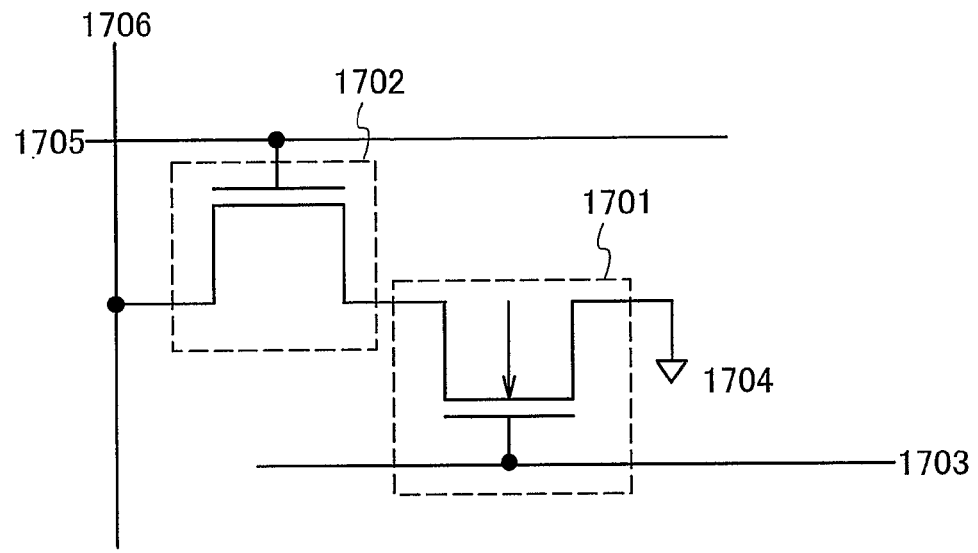
FIGS. 17A and 17B are diagrams each describing a configuration of a memory cell of a memory device of the invention.
Figure 17B:
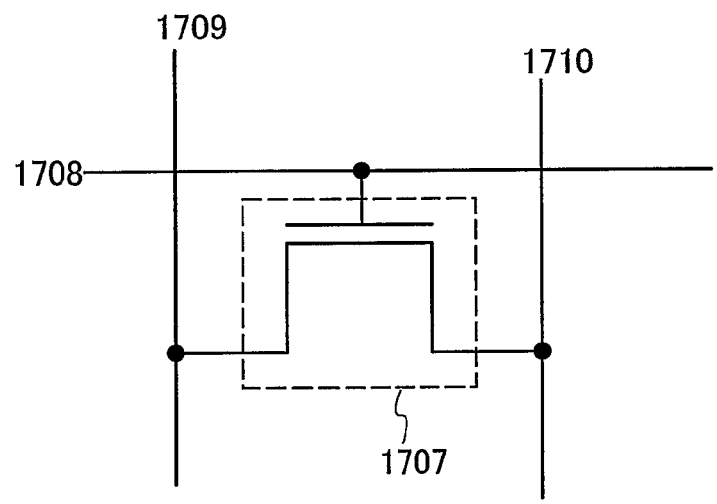

Examples of a memory cell for forming the memory device are shown in FIGS. 17A and 17B. FIG. 17B shows an example of a memory cell which includes only a memory element 1707. The memory element 1707 is a three-terminal element because it has the same shape as a TFT, and a gate electrode thereof is connected to a word line 1708 and one of high concentration impurity regions (a source or drain) is connected to a bit line 1709. The other high concentration impurity region is connected to a signal line 1710.

FIG. 17A shows an example of a memory cell which includes a selection transistor 1701 and a memory element 1702. A gate electrode of the selection transistor 1701 is connected to a word line 1703 for selecting the TFT and one of high concentration impurity regions (a source or drain) thereof is connected to a constant potential source 1704 such as ground. The other high concentration impurity region is connected to the memory element. The memory element 1702 is also structured by three terminals of a gate electrode and two high concentration impurity regions like a TFT, and the gate electrode is connected to a word line 1705 for selecting the memory element and one of the two high concentration impurity regions is connected to a bit line 1706. The other high concentration impurity region is connected to the selection transistor.

Figure 18A:
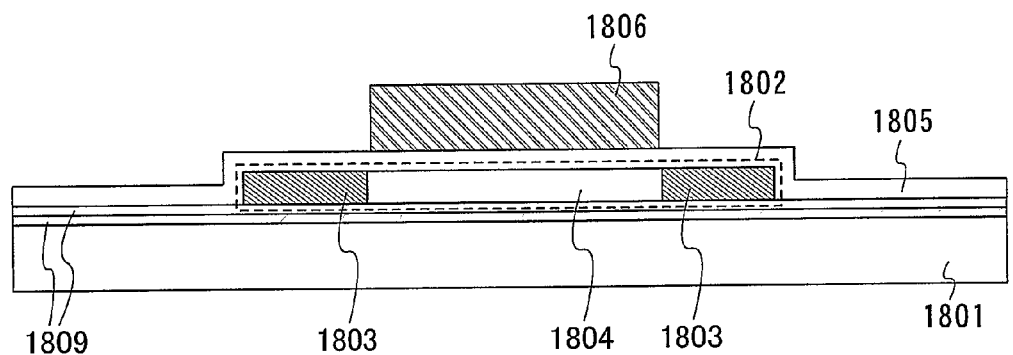
FIGS. 18A and 18B are cross-sectional views of a memory element before and after voltage has been applied.

A cross-sectional view of a memory element is shown in FIG. 18A. As for a TFT manufactured over an insulating substrate, a channel region of the TFT is insulated when a voltage which is higher than a voltage for normally driving as a TFT is applied between a gate electrode and at least one of two impurity regions (a source or drain). For example, a memory element shown in FIG. 18A has a semiconductor film 1802, a gate insulating film 1805, and a gate electrode 1806 over an insulating substrate 1801. Here, over the insulating substrate 1801, the semiconductor film 1802 can also be formed after a passivation film 1809 corresponding to a base is formed. The semiconductor film 1802 has two high concentration impurity regions 1803 and a channel region 1804.

Figure 18B:
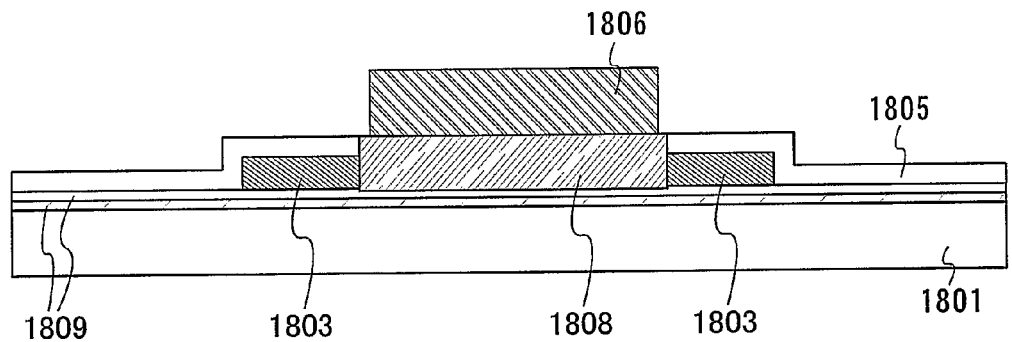

FIG. 18B is a pattern diagram of the memory element after a high voltage has been applied to the gate electrode and one of the two high concentration impurity regions. In the memory element shown in FIG. 18B, at least the channel region 1804 of the semiconductor film changes in quality to form an insulated region 1808 below the gate electrode. Thus, a portion between three terminals of the gate electrode and the two high concentration impurity regions 1803 is entirely insulated. The insulated region 1808 is shown schematically in FIG. 18B, and the insulated region takes various shapes really.

When a voltage (herein referred to as a "writing voltage") which is higher than a voltage for normally driving the TFT is applied between the gate electrode and at least one of the two impurity regions, current flows to the gate insulating film to generate heat. Since the heat conductivity of an insulating substrate is essentially low, a large amount of heat generated in an element manufactured over the insulating substrate cannot escape anywhere, and the heat changes the quality of the gate insulating film or the semiconductor film. Hereby, a portion between the three terminals of the gate electrode and the two high concentration impurity regions can be entirely insulated.

In this embodiment, utilizing the above-described mechanism, a state of "1" means a memory element before voltage has been applied while a state of "0" means a memory element in which a channel region is insulated by applying a writing voltage to the memory element. Correspondence between a state of the memory element and reference symbol "0" or "1" is not limited to this, however, the above-described correspondence is used in this specification of the invention for convenience.

Figure 19:
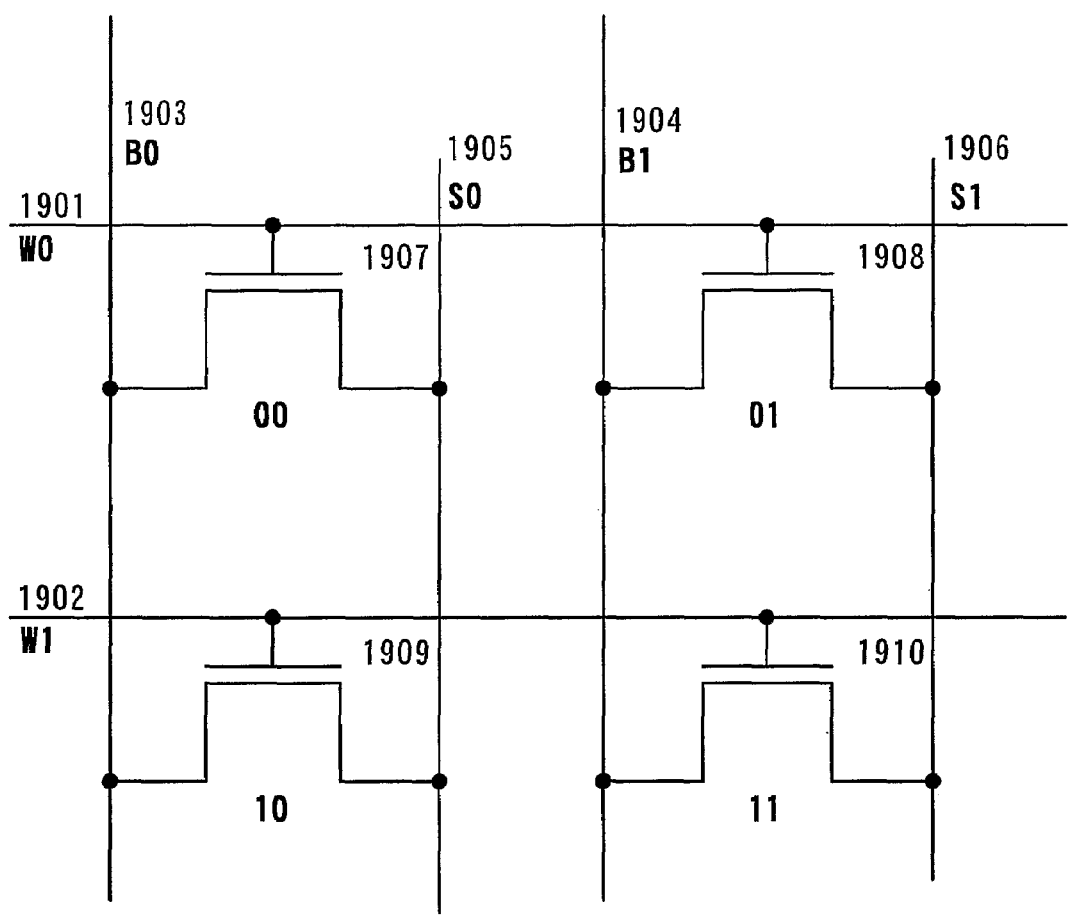
FIG. 19 is a diagram describing a configuration of a memory device having a 4-bit memory cell array.

Here, in order to describe a circuit operation simply, a memory device of a 4-bit memory cell array is shown in FIG. 19. Described here is an example in which a memory cell includes only a memory element. The memory cell array includes two word lines 1901 and 1902, two bit lines 1903 and 1904, two source lines 1905 and 1906, and four memory elements 1907 to 1910. In each of the memory elements 1907 to 1910, for example, a channel region is insulated by applying a voltage of V1 or more for a time of t1 second or more between a gate electrode and one or both of high concentration impurity regions.

Here, an example of a circuit operation for writing "0" into the memory element 1907 is described. The writing can be performed by applying a writing voltage between a gate electrode and at least one of two impurity regions of the memory element 1907. Therefore, by applying a voltage V1 to the word line 1901 and applying 0 V to the bit line 1903 and the source line 1905 for a time of t1 second, data can be written into the memory element.

At this time, it is necessary to determine respective voltages of the word line 1902, the bit line 1904, and the source line 1906 such that "0" is not written into the other memory elements. For example, at the same time of the writing voltage, a voltage of 0 V is applied to the word line 1902 and a voltage of V2 (0<V2<V1) is applied to the bit line 1904 and the source line 1906 so that the writing voltage can be applied only to the memory element 1907 to perform the writing. The voltage V2 is set to satisfy 0<V2<V1 here, and further, the voltage V2 may be preferably about half of the voltage V1; this is because a potential difference applied to the memory element 1908 when the writing operation into the memory element 1907 is performed becomes minimum so that mistaken writing can be prevented.

Next, an example of a circuit operation for writing "1" into the memory element 1907 is described. Writing "1" into the memory element 1907 means to keep the initial state without applying a writing voltage. Therefore, all the word lines 1901 and 1902, bit lines 1903 and 1904, and source lines 1905 and 1906 may have the same voltage so that a writing operation of "0" is not performed. This is just an example and respective potentials of the word lines 1901 and 1902, bit lines 1903 and 1904, and source lines 1905 and 1906 may be determined arbitrarily by a circuit control.

A reading operation of the memory element 1907 is described next. The reading operation can be performed by determining whether the memory element 1907 is in the state of "1", namely remains a TFT to which a writing operation has not been performed or the memory element 1907 is in the state of "0", namely the channel region of the memory element 1907 is altered to be an insulated state by a writing operation. Thus, a voltage V3 of a threshold or higher is applied to the gate electrode of the memory element 1907 to determine whether current flows between the two high concentration impurity regions or not.

For example, as one example of the operation, the bit line 1903 is precharged before the reading operation and it is set such that a potential of the bit line 1903 is read by applying a voltage V3 to the word line 1901 and applying a voltage 0 V to the source line 1905. If the memory element 1907 is in the state of "1" to which a writing operation has not been performed, the two impurity regions are electrically connected to each other since the voltage V3 is applied to the word line 1901, and the voltage of the bit line 1903 is 0 V. On the other hand, if the memory element 1907 is in the state of "0" to which a writing operation has been performed, the potential of the bit line 1903 remains the precharge voltage since the bit line 1903 and the source line 1905 are insulated.

At this time, it is necessary to determine respective voltages of the word line 1902, the bit line 1904, and the source line 1906 such that data of other memory element is not read. For example, a voltage of 0 V is applied to the word line 1902 and the source line 1906 and the bit line 1904 is not selected for reading to prevent the above-described problem.

Figure 20A:
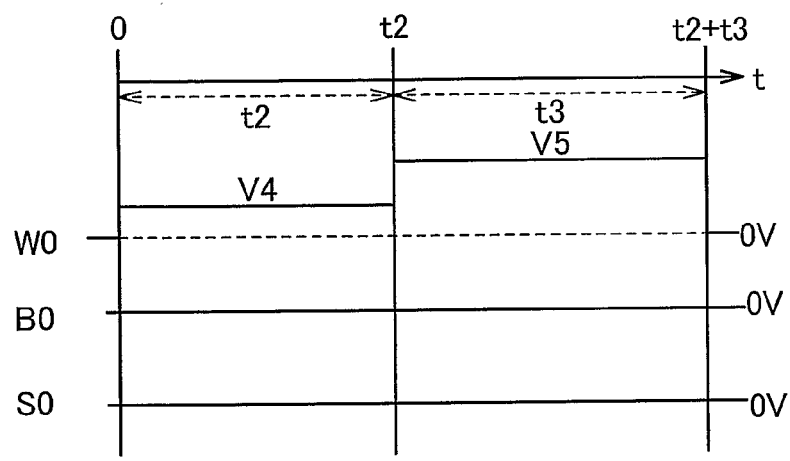
FIGS. 20A to 20C are timing charts describing a writing.
Figure 20B:
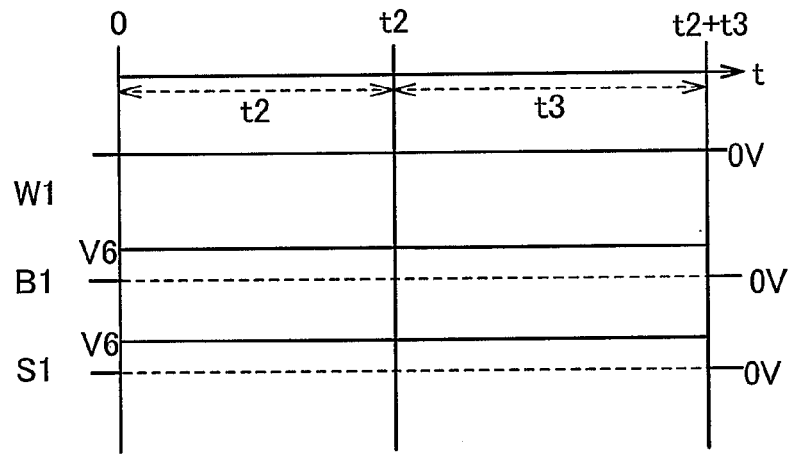
Figure 20C:
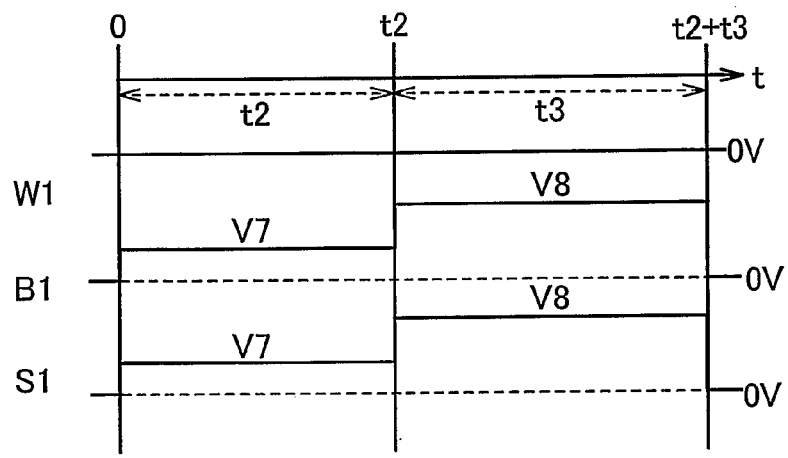

For example, an example of a case where "0" is written into the memory element 1907 is described with reference to FIGS. 20A to 20C. First, during a period from a start of the writing to a time t2, a first voltage V4 is applied to the word line 1901 and 0 V is applied to the bit line 1903 and the source line 1905 as shown in FIG. 20A. Then, during a period of t3 from the time t2, a second voltage V5 is applied to the word line 1901 and 0 V is applied to the bit line 1903 and the source line 1905.

As for the time t shown in the figures, where the time when the writing starts is 0, a voltage is switched at the time t2 and the writing is completed at a time t2+t3. According to the invention, the respective times t2 and t3 satisfy 0<t2<t2+t3 and t3 is smaller than t1 here. In addition, the applied voltages V4 and V5 satisfy 0<V4<V5 and V5 is smaller than V1.

It is necessary to determine respective voltages of the word line 1902, the bit line 1904, and the source line 1906 such that writing is not performed to other memory element at this time. For example, as shown in FIG. 20B, 0 V is applied to the word line 1902 and a voltage V6 is applied to the bit line 1904 and the source line 1906 during the above-described writing period so that the mistaken writing can be prevented. Alternatively, 0 V may be applied to the word line 1902 during the writing period as shown in FIG. 20C, while to the bit line 1904 and the source line 1906, a voltage V7 may be applied during a period from the start of the writing to the time t2 and a voltage V8 may be applied during the period t3 to prevent the mistaken writing.

By applying a writing voltage separately at plural levels as described above, a voltage applied to a memory element to which writing is not to be performed of the same word line or the bit line can be reduced. Accordingly, by employing the writing method of the invention, mistaken writing to a memory element other than a memory element to which writing is to be performed can be reduced.

The applied voltage to each line described above can be arbitrarily determined depending on operation characteristics such as a driving voltage or a writing voltage of the memory element. Besides, the applied voltage can be applied by dividing into two levels as described above, and it can also be applied by dividing into three or more levels.

Figure 21:
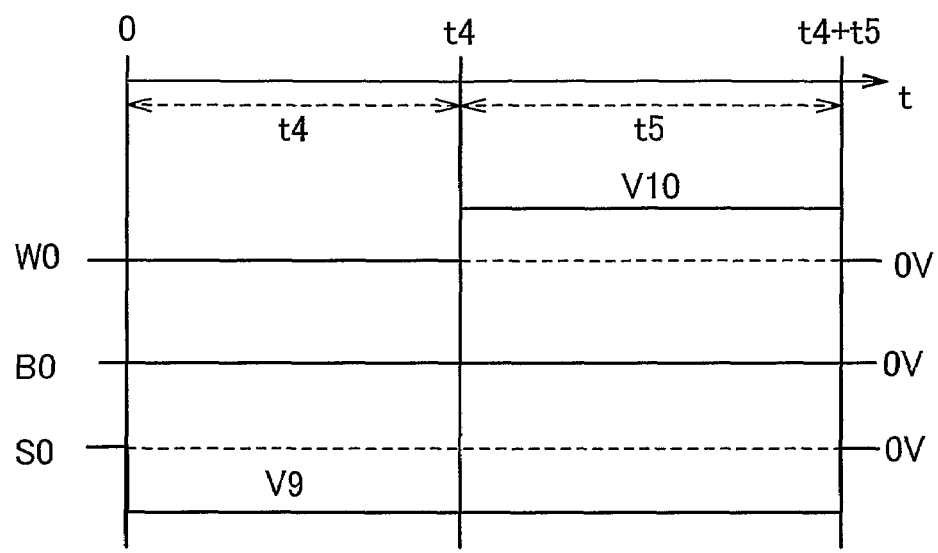
FIG. 21 is a timing chart describing a writing.

Next, another example of writing "0" into the memory element 1907 is described with reference to FIG. 21A. First, 0 V is applied to the bit line 1903 and a negative voltage V9 is applied to the source line 1905 during a period from a start of the writing to an end thereof. 0 V is applied to the word line 1901 during a period from the start of the writing to a time t4 and a positive voltage V10 is applied during a period of t5 from the time t4 so that the writing can be performed.

As for the time t shown in the figure, where the time when the writing starts is 0 like in the above-described example, a voltage is switched at the time t4 and the writing is completed at a time t4+t5. According to the invention, the respective times t4 and t5 satisfy 0<t4<t4+t5 and t5 is smaller than t1 here. In addition, the applied voltages V9 and V10 satisfy 0<|V9|<|V9|+|V10| and |V9|+|V10| is smaller than V1.

It is necessary to determine respective voltages applied to the word line 1902, the bit line 1904, and the source line 1906 such that writing is not performed to adjacent other memory element at this time. In the case where the applied voltages satisfy |V9|=|V10|, for example, mistaken writing does not occur if 0 V is applied to the word line 1902, the bit line 1904, and the source line 1906 since a voltage applied to each of the other memory elements do not reach the writing voltage.

Furthermore, utilizing that writing is performed by changing a voltage in terms of time, mistaken writing to other memory element can be prevented. That is, in the case where a high voltage which is not so high as the writing voltage V1 is applied to a memory element to which writing is not to be performed, voltage is applied step-by-step to the word line 1902, the bit line 1904, and the source line 1906 such that the high voltage is not applied for a period longer than the period t1 required for writing.

A method for applying a writing voltage described herein is not limited to the above-described method, and the applied voltage may be changed or switched as well. For example, although the positive voltage is applied step-by-step to the word line 1901 and the negative voltage is applied step-by-step to the source line 1905 in the above-described example, a method in which a positive voltage is applied to the bit line 1903 and a negative voltage is applied step-by-step to the word line 1901, or the like may be employed. That is, the invention is not limited to the above-described method, and a voltage by which mistaken writing does not occur can be applied depending on the circuit operation.

In this manner, in this embodiment, a memory cell which takes a binary of "a switching element" and "an insulator" can be formed only by one TFT. This can be formed similarly to a TFT for forming a peripheral circuit, therefore, a manufacturing cost can be reduced. Further, since the memory cell can be formed only by one memory element, an area of a memory cell array can be reduced and there is also an advantage for increasing the storage capacitance.

In addition, by employing the writing method of the invention for the memory, the probability of occurring mistaken writing to an adjacent memory can be reduced so that a memory device with high reliability can be provided.

Furthermore, by employing the writing method of the invention for the memory, a writing voltage can be decreased so that low-power-consumption drive can be realized. For example, such a write-once memory may be applied to an RFID (called various names such as an "IC tag" or an "ID chip") which communicates by radio frequency and the like. RFID which is supplied power by radio frequency and communicates by radio frequency, is desirably operated with power as less as possible. In such a case, the writing method of the invention can provide a method for realizing low power consumption.

It is to be noted that this embodiment can be freely combined with the above-described Embodiment Modes 1 to 3 and Embodiments 1 to 4 to implement.

(Embodiment 6)

In this embodiment, described is an example in which the writing method of the invention is employed for a nonvolatile memory having a floating gate such as a flash memory. According to the writing method of the invention, a plurality of levels of a voltage is applied to a memory element continuously to change conductivity of the memory element. Therefore, where n is an integral number of 2 or more, a writing circuit included in a memory device of the invention includes a voltage generating circuit for generating n levels of a voltage V1 to Vn and a timing controlling circuit for controlling so as to output the n levels of a voltage continuously. Then, the writing is performed by applying the voltages V1 to Vn continuously in applied periods t1 to tn.

Figure 22:
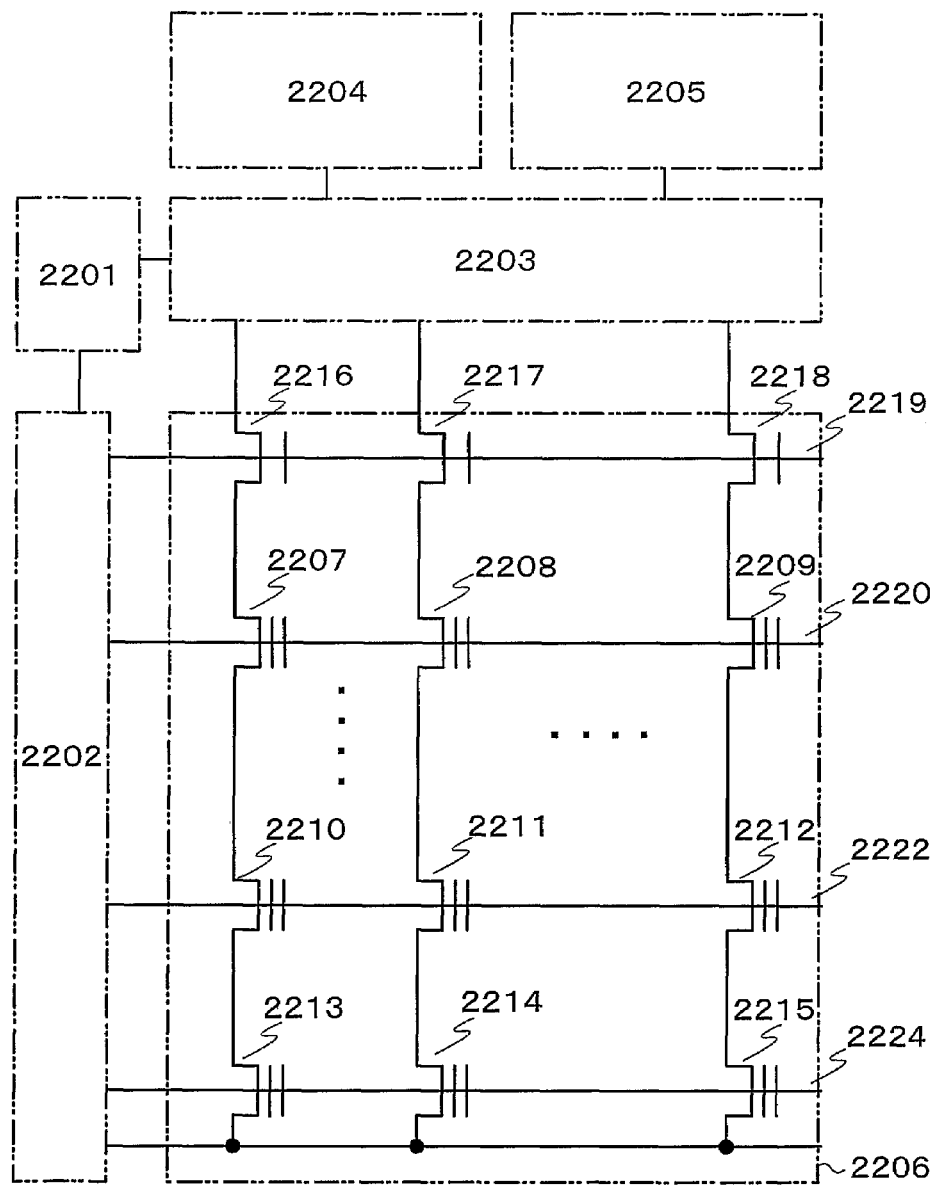
FIG. 22 is a diagram describing constitution of a memory device having a flash memory.

FIG. 22 is a diagram of a memory device having a flash memory in which memory elements are connected in series, as one example of a nonvolatile memory. In FIG. 22, the memory device includes a column decoder 2201, a row decoder 2202, a reading circuit 2204, a writing circuit 2205, a selector 2203, and a memory cell array 2206. The memory cell array is configured by memory elements 2207 to 2215, transistors 2216 to 2218, and signal lines 2219 to 2224. In the memory device having the above-described circuit configuration, when writing is performed to a memory element of the m-th row and the n-th column, memory elements of the m-th row are selected through the selector 2203 while memory elements of the n-th column are selected through the signal lines 2219 to 2224. Then, a plurality of levels of a voltage is applied continuously to the memory element from the writing circuit 2205 so that writing can be performed.

Figure 23:
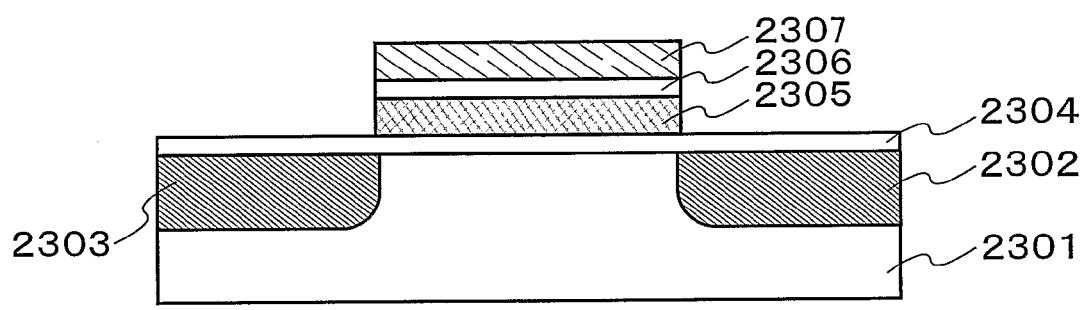
FIG. 23 is a diagram describing a structure of a memory element of a flash memory.

Next, a structure example of the memory element included in the flash memory is shown in FIG. 23. The memory element is structured by a substrate 2301, high concentration impurity regions (a source or drain) 2302 and 2303, a first oxide film 2304, a floating gate 2305, a second oxide film 2306, and a control gate 2307. In addition, the floating gate 2305 is wrapped with an oxide film, which is not electrically connected to anywhere.

Descried next is an example of writing is performed to the memory element of the above-described structure. Voltages V1 and V2 are applied continuously to at least one of the high concentration impurity regions (a source or drain), and voltages V3 and V4 are applied continuously to the control gate so as to become positive with respect to the high concentration impurity regions (a source or drain). That is to say, by applying a potential difference between the high concentration impurity regions (a source or drain) and the control gate, a floating gate is injected into the floating gate to perform writing.

That is, according to the writing method of the invention, the voltages V1 to Vn are applied to the memory element in the applied periods t1 to tn continuously to inject a free electron into the floating gate. When the invention is implemented, the integral numeral n, the voltage Vn, and the applied period tn are determined in consideration of size of the memory element, thickness of the floating gate and an oxide film, or the like. The integral numeral n is preferably about 2 to 5.

By applying a plurality of levels of a voltage continuously to the control gate, the source electrode and the drain electrode of the memory element, writing to the nonvolatile memory having the floating gate such as the flash memory can be performed. By employing the means of the invention, an applied voltage when writing can be reduced so that current consumption of the nonvolatile memory can be reduced.

Writing and erasing of a flash memory require a high voltage of about 12 to 13 V and such a voltage is generated by a voltage step-up circuit for generating a high voltage by using a power source voltage and a clock pulse. The voltage step-up circuit is configured by a diode and a capacitor (or an inductor and the like), and power consumption of the voltage step-up circuit itself and including that of a buffer or the like for driving the voltage step-up circuit is quite large. This power consumption becomes large as an absolute value of the voltage to be generated is increased. Therefore, by performing writing to the memory element by applying a plurality of levels of a voltage by employing the invention, circuit area of the voltage step-up circuit can be reduced to reduce the power consumption.

Further, if a high pulse voltage is applied to a memory element, writing is performed to an adjacent memory element mistakenly. By employing the writing method of the invention, it is prevented to apply a high voltage to an adjacent memory element and possibility of the mistaken writing can be reduced. In addition, in the case where writing using a tunneling current is performed for example, a period where a writing voltage is maximum can be shortened so that generation and injection of hot electrons can be suppressed to prevent deterioration of an oxide film.

It is to be noted that this embodiment can be freely combined with the above-described Embodiment Modes 1 to 3 and Embodiments 1 to 5 to implement.

(Embodiment 7)

In this embodiment, specific examples of use of the semiconductor device of the invention are described.

The semiconductor device of the invention can be applied in various fields. For example, a wireless tag that is one mode of the semiconductor device of the invention can be provided for bills, coins, securities, certificates, bearer bonds, packing containers, books, a recording medium, personal items, vehicles, food items, garments, healthcare items, livingwares, medicals, an electronic apparatus, and the like.

The bills and the coins refer to currency in the market and include a note that is a currency in a specific area (cash voucher), memorial coins and the like. The securities refer to a check, a stock certificate, a promissory note, and the like. The certificates include a driver's license, a resident card and the like. The bearer bonds include a stamp, rice coupon, various gift coupons and the like. The packing containers include a wrapping paper of a lunch box or the like, a plastic bottle and the like. The books include a book, a volume and the like. The recording medium includes DVD software, a video tape and the like. The personal items include a bag, glasses and the like. The vehicles include a wheeled vehicle such as a bicycle, a vessel and the like. The food items include foods, beverages and the like. The garments include clothing, footwear and the like. The healthcare items include medical devices, health appliances and the like. The livingwares include furniture, a lighting apparatus and the like. The medicals include medicines, agricultural chemicals and the like. The electronic apparatus include a liquid crystal display device, an EL display device, a TV set (a TV receiver or a thin TV receiver), a mobile phone, and the like.

When the wireless tag is provided for the bills, the coins, the securities, the certificates, the bearer bonds, and the like, counterfeiting thereof can be prevented. When the wireless tag is provided for the packing containers, the books, the recording medium, the personal items, the food items, the livingwares, the electronic apparatus, and the like, efficiency of an inspection system or a rental system and the like can be improved. When the wireless tag is provided for the vehicles, the healthcare items, the medicals and the like, counterfeiting and theft thereof can be prevented and the medicines can be prevented from being taken in the wrong manner. The wireless tag may be attached to a surface of a product or implanted in a product. For example, the wireless tag may be implanted in a page of a book, or an organic resin of a package formed of the organic resin.

Figure 24A:
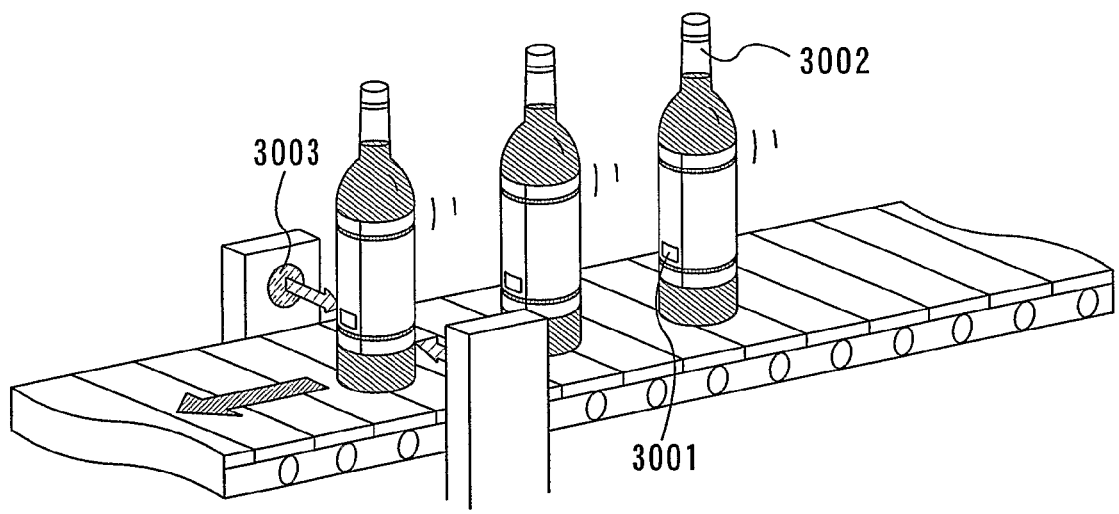
FIGS. 24A and 24B show application examples of a semiconductor device of the invention.

As set forth above, by applying the semiconductor device to product management or distribution system, high performance system can be achieved. For example, as shown in FIG. 24A, a reader/writer 3003 is provided on the side of a belt conveyor and a product 3002 providing a semiconductor device 3001 of the invention is conveyed through the belt conveyor so that inspection of the product 3002 can be easily performed.

Figure 24B:
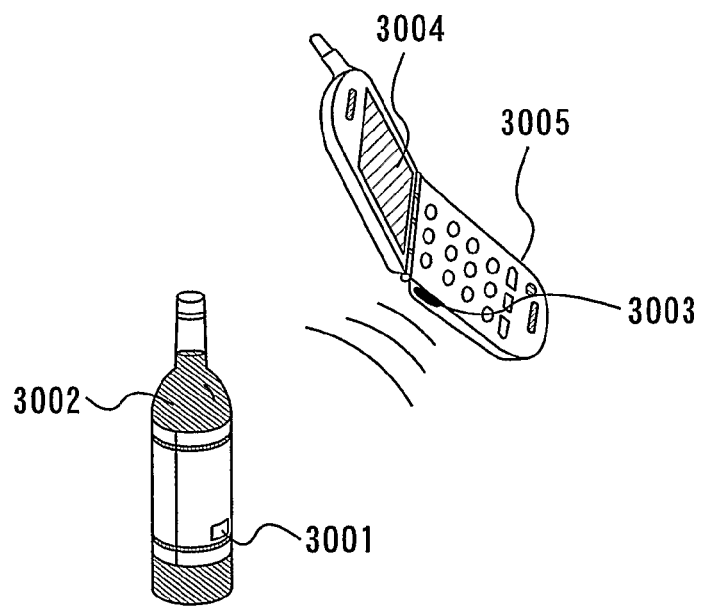

Furthermore, the following system can be constructed; as shown in FIG. 24B, the reader/writer 3003 is provided on the side of a portable terminal 3005 including a display portion 3004, toward which the semiconductor device 3001 provided in the inspected product 3002 so that data on the product 3002 such as ingredients, a place of origin, and a record of the distribution process or the like is displayed in the display portion 3004.

It is to be noted that this embodiment can be freely combined with the above-described Embodiment Modes 1 to 3 and Embodiments 1 to 6 to implement.

The present application is based on Japanese Priority application No. 2005-022302 filed on Jan. 28, 2005 with the Japanese Patent Office, the entire contents of which are hereby incorporated by reference.

EXPLANATION OF REFERENCE

101: conductive layer, 102: organic compound layer, 103: conductive layer, 501: column decoder, 502: row decoder, 503: selector, 504: circuit, 505: circuit, 506: memory cell array, 507: memory cell, 508: memory device, 601: transistor, 602: memory element, 603: common electrode, 604: rectifying element, 701: voltage generating circuit, 702: timing controlling circuit, 1001: semiconductor device, 1002: resonant circuit, 1003: power supply circuit, 1004: clock generating circuit, 1005: demodulating circuit, 1006: controlling circuit, 1007: nonvolatile memory, 1008: encoding circuit, 1009: modulating circuit, 1010: reader/writer, 1011: communication line, 1012: computer, 1701: transistor, 1702: memory element, 1703: word line, 1704: constant potential source, 1705: word line, 1707 memory element, 1708 word line, 1709: bit line, 1710: signal line, 1801: insulating substrate, 1802: semiconductor film, 1803: high concentration impurity region, 1804: channel region, 1805: gate insulating film, 1806: gate electrode, 1808: region, 1809: passivation film, 1901: word line, 1902: word line, 1905: source line, 1906: source line, 1907: memory element, 1908: memory element, 1909: memory element, 1910: memory element, 2001: column decoder, 2002: row decoder, 2003: circuit, 2005: selector, 2006: memory cell array, 2007: voltage generating circuit, 2008: sense amplifier, 2009: resistor, 2010: data outputting circuit, 2001: memory cell, 2012: transistor, 2013: memory element, 2014: common electrode, 2015: I-V characteristics, 2016: I-V characteristics, 2017: I-V characteristics, 2201: column decoder, 2202: row decoder, 2203: selector, 2204: circuit, 2205: circuit, 2206: memory cell array, 2207: memory element, 2216: transistor, 2219: signal line, 2301: substrate, 2302: drain, 2304: oxide film, 2305: floating gate, 2306: oxide film, 2307: control gate, 3001: semiconductor device, 3002: product, 3003: reader/writer, 3004: display portion, 3005: portable terminal, 4001: glass substrate, 4002: peeling layer, 4003: insulating layer, 4004: semiconductor layer, 4005: gate insulating layer, 4006: gate electrode layer, 4007: N-type impurity region, 4008: P-type impurity region, 4009: insulating layer, 4010: N-type impurity region, 4011: N-type impurity region, 4012: N-type transition, 4013: N-type transistor, 4014: insulating layer, 4015: conductive layer, 4016: insulating layer, 4017: conductive layer, 4018: insulating layer, 4019: antenna, 4020: organic compound layer, 4021: conductive layer, 4022: passivation layer, 4023: organic compound layer, 4024: insulating layer, 4025: conductive layer, 4026: passivation layer, 4027: opening, 4028: element group, 4029: flexible substrate, 4030: flexible substrate

The invention claimed is:

1. A memory device comprising:
   a memory cell array in which memory elements are arranged in matrix; and
   a writing circuit,
   wherein the memory element has a semiconductor film including two impurity regions, an insulating film over the semiconductor film, and an electrode over the insulating film; and wherein the writing circuit includes a voltage generating circuit for generating a voltage in order to apply to the memory element at plural times, a first switch, a second switch, a third switch, an output terminal, and a timing controlling circuit for controlling an output of the voltage, wherein a source or drain of each of the first, second and third switch is electrically connected to each other, wherein control signals from the timing controlling circuit are applied to a gate of each of the first, second and third switch, wherein the first switch is electrically connected to the timing controlling circuit and the output terminal, wherein the second switch is electrically connected to the voltage generating circuit and the output terminal, wherein the third switch is electrically connected to the voltage generating circuit and the output terminal, and wherein the source or drain of the first switch is electrically connected to a constant potential source.

2. The memory device according to claim 1, further comprising a transistor, wherein the transistor is electrically connected to the memory element.

3. The memory device according to claim 1, wherein the memory element stores whether conductivity of at least one of the semiconductor film and the insulating film is changed or not.

4. The memory device according to claim 1, wherein the voltage generating circuit has a function of generating a first voltage and a second voltage which is higher than the first voltage; and
wherein the timing controlling circuit has a function of generating a first pulse having the first voltage and a second pulse having the second voltage continuously.

5. The memory device according to claim 1, wherein the memory cell array and the writing circuit are provided over a glass substrate or a flexible substrate.

6. The memory device according to claim 1, wherein the writing circuit includes a thin film transistor.

7. A memory device comprising:
a memory cell array in which memory elements are arranged in matrix; and
a writing circuit,
wherein the memory element has a first conductive layer and a second conductive layer on a semiconductor region including two impurity regions; and
wherein the writing circuit includes a voltage generating circuit for generating a voltage in order to apply to the memory element at plural times, a first switch, a second switch, a third switch, an output terminal, and a timing controlling circuit for controlling an output of the voltage, wherein a source or drain of each of the first, second and third switch is electrically connected to each other, wherein control signals from the timing controlling circuit are applied to a gate of each of the first, second and third switch, wherein the first switch is electrically connected to the timing controlling circuit and the output terminal, wherein the second switch is electrically connected to the voltage generating circuit and the output terminal, wherein the third switch is electrically connected to the voltage generating circuit and the output terminal, and wherein the source or drain of the first switch is electrically connected to a constant potential source.

8. The memory device according to claim 7, further comprising a transistor, wherein the transistor is electrically connected to the memory element.

9. The memory device according to claim 7, wherein the second conductive layer is surrounded by an insulator.

10. The memory device according to claim 7,
wherein the voltage generating circuit has a function of generating a first voltage and a second voltage which is higher than the first voltage; and
wherein the timing controlling circuit has a function of generating a first pulse having the first voltage and a second pulse having the second voltage continuously.

11. The memory device according to claim 7, wherein the memory cell array and the writing circuit are provided over a glass substrate or a flexible substrate.

12. The memory device according to claim 7, wherein the writing circuit includes a thin film transistor.

13. A semiconductor device comprising a controlling circuit, a nonvolatile memory, and an antenna or a wire for connecting an antenna,
wherein the controlling circuit has a function of controlling the nonvolatile memory;
wherein the nonvolatile memory includes a memory cell array in which memory cells are arranged in matrix and a writing circuit;
wherein the memory cell has a transistor and a memory element;
wherein the memory element has a semiconductor film having two impurity regions, an insulating film over the semiconductor film, and an electrode over the insulating film; and
wherein the writing circuit includes a voltage generating circuit for generating a voltage in order to apply to the memory element at plural times, a first switch, a second switch, a third switch, an output terminal, and a timing controlling circuit for controlling an output of the voltage, wherein a source or drain of each of the first, second and third switch is electrically connected to each other, wherein control signals from the timing controlling circuit are applied to a gate of each of the first, second and third switch, wherein the first switch is electrically connected to the timing controlling circuit and the output terminal, wherein the second switch is electrically connected to the voltage generating circuit and the output terminal, wherein the third switch is electrically connected to the voltage generating circuit and the output terminal, and wherein the source or drain of the first switch is electrically connected to a constant potential source.

14. The semiconductor device according to claim 13, wherein the memory element stores whether conductivity of at least one of the semiconductor film and the insulating film is changed or not.

15. The memory device according to claim 13, wherein the voltage generating circuit has a function of generating a first voltage and a second voltage which is higher than the first voltage; and
wherein the timing controlling circuit has a function of generating a first pulse having the first voltage and a second pulse having the second voltage continuously.

16. The memory device according to claim 13, wherein the memory cell array and the writing circuit are provided over a glass substrate or a flexible substrate.

17. The memory device according to claim 13, wherein the writing circuit includes a thin film transistor.

18. A semiconductor device comprising a controlling circuit, a nonvolatile memory, and an antenna or a wire for connecting an antenna, wherein the controlling circuit has a function of controlling the nonvolatile memory;
wherein the nonvolatile memory includes a memory cell array in which memory cells are arranged in matrix and a writing circuit;
wherein the memory cell has a transistor and a memory element;
wherein the memory element has a first conductive layer and a second conductive layer on a semiconductor region including two impurity regions; and
wherein the writing circuit includes a voltage generating circuit for generating a voltage in order to apply to the memory element at plural times, a first switch, a second switch, a third switch, an output terminal, and a timing controlling circuit for controlling an output of the voltage,
wherein a source or drain of each of the first, second and third switch is electrically connected to each other,
wherein control signals from the timing controlling circuit are applied to a gate of each of the first, second and third switch,
wherein the first switch is electrically connected to the timing controlling circuit and the output terminal,
wherein the second switch is electrically connected to the voltage generating circuit and the output terminal,
wherein the third switch is electrically connected to the voltage generating circuit and the output terminal, and
wherein the source or drain of the first switch is electrically connected to a constant potential source.

19. The semiconductor device according to claim 18, wherein the second conductive layer is surrounded by an insulator.

20. The semiconductor device according to claim 18, wherein the voltage generating circuit has a function of generating a first voltage and a second voltage which is higher than the first voltage; and
wherein the timing controlling circuit has a function of generating a first pulse having the first voltage and a second pulse having the second voltage continuously.

21. The semiconductor device according to claim 18, wherein the memory cell array and the writing circuit are provided over a glass substrate or a flexible substrate.

22. The semiconductor device according to claim 18, wherein the writing circuit includes a thin film transistor.

* * * * *